(12) United States Patent
Jin et al.

(10) Patent No.: US 12,046,433 B2
(45) Date of Patent: Jul. 23, 2024

(54) ELECTRICAL SYSTEM WITH ON-LINE SAMPLING VERIFICATION FUNCTION AND VERIFICATION METHOD THEREOF

(71) Applicant: SHANGHAI ROYE ELECTRIC CO., LTD., Shanghai (CN)

(72) Inventors: Haiyong Jin, Shanghai (CN); Tiexin Xia, Shanghai (CN); Xiaobeng Huang, Shanghai (CN); Zhengcao Guo, Shanghai (CN); Min Chang, Shanghai (CN); Lele Wang, Shanghai (CN)

(73) Assignee: Shanghai Roye Electric Co., Ltd., Shanghai (CN)

( * ) Notice: Subject to any disclaimer, the term of this patent is extended or adjusted under 35 U.S.C. 154(b) by 342 days.

(21) Appl. No.: 17/640,779

(22) PCT Filed: Aug. 26, 2020

(86) PCT No.: PCT/CN2020/111250
§ 371 (c)(1),
(2) Date: Mar. 4, 2022

(87) PCT Pub. No.: WO2021/043038
PCT Pub. Date: Mar. 11, 2021

(65) Prior Publication Data
US 2022/0336171 A1      Oct. 20, 2022

(30) Foreign Application Priority Data

Sep. 4, 2019    (CN) .......................... 201910830196.X

(51) Int. Cl.
*H01H 35/26*      (2006.01)
*G01N 9/26*      (2006.01)
(Continued)

(52) U.S. Cl.
CPC ............... *H01H 35/26* (2013.01); *G01N 9/26* (2013.01); *G01R 31/3271* (2013.01);
(Continued)

(58) Field of Classification Search
CPC ............ G01R 31/3278; G01R 31/3271; G01R 31/327; H01H 33/563; H01H 35/28; G01N 9/26; G01N 9/00; G01D 21/02
(Continued)

(56) References Cited

U.S. PATENT DOCUMENTS 5,388,451 A        2/1995   Stendin et al.
2022/0334184 A1*  10/2022  Chang ................. G01R 31/3278
(Continued)

FOREIGN PATENT DOCUMENTS

CN          101937060          1/2011
CN          102136689          7/2011
(Continued)

*Primary Examiner* — Giovanni Astacio-Oquendo
(74) *Attorney, Agent, or Firm* — Hsuanyeh Law Group, PC

(57) ABSTRACT

The application provides an electrical system with online sampling and check function and its check method for high-voltage and medium-voltage electrical equipment, including electrical equipment, gas density relay, gas density sensor, temperature regulation mechanism, online check contact signal sampling unit and intelligent control unit. The temperature rise and fall of the temperature compensation element of the gas density relay is regulated through the temperature regulation mechanism to enable the contact action of the gas density relay of electrical equipment. The contact action is transmitted to the intelligent control unit through the online check contact signal sampling unit. The intelligent control unit detects the alarm and/or blocking contact signal operating value and/or return value according to the density value of the contact action; the check of the gas density relay can be completed without maintenance
(Continued)

personnel on site, which greatly improves the reliability of the power grid and the work efficiency, and reduces the O&M cost. At the same time, it also realizes the mutual self-inspection between gas density relay and gas density sensor, and further realizes the maintenance-free.

20 Claims, 5 Drawing Sheets

(51) Int. Cl.
  *G01R 31/327* (2006.01)
  *H01H 35/32* (2006.01)
  *H02B 13/065* (2006.01)
  *H01H 35/36* (2006.01)
(52) U.S. Cl.
  CPC .......... *H01H 35/32* (2013.01); *H02B 13/065* (2013.01); *H01H 35/36* (2013.01); *H01H 2300/052* (2013.01)

(58) Field of Classification Search
  USPC .................. 324/418, 415, 422, 423, 421
  See application file for complete search history.

(56) References Cited

U.S. PATENT DOCUMENTS

| | | | | |
|---|---|---|---|---|
| 2022/0336170 A1* | 10/2022 | Xia | ............ | H01H 35/32 |
| 2023/0160800 A1* | 5/2023 | Huang | ............ | G01R 31/327 |
| | | | | 73/30.02 |

FOREIGN PATENT DOCUMENTS

| | | |
|---|---|---|
| CN | 203481694 | 3/2014 |
| CN | 204230151 | 3/2015 |
| CN | 105932590 | 9/2016 |
| CN | 207779463 | 8/2018 |
| CN | 110535058 | 12/2019 |
| CN | 210720654 | 6/2020 |

* cited by examiner

ELECTRICAL SYSTEM WITH ON-LINE SAMPLING VERIFICATION FUNCTION AND VERIFICATION METHOD THEREOF This application claims priority to Chinese patent application No. 201910830196.X, filed on Sep. 4, 2019 and entitled "Electrical System with Online Sampling Check Function and Check Method Thereof".

TECHNICAL FIELD

The invention relates to the technical field of electric power, in particular to an electrical system (or electrical equipment) with an online check sampling function and a check method thereof applied to high-voltage and medium-voltage electrical equipment.

BACKGROUND

The gas density relay is generally configured to monitor and control the density of insulation gas in the high-voltage electrical equipment, a contact signal control loop is arranged inside, and a gas path of the gas density relay is communicated with the air chamber of the high-voltage electrical equipment. When gas leakage is detected, the contact of the gas density relay acts to generate a contact signal, and the contact signal control loop sends out an alarm or performs blocking according to the contact signal, so as to achieve the safety operation protection of the electrical equipment.

At present, $SF_6$ (sulfur hexafluoride) electrical equipment has been widely applied to electric power departments and industrial and mining enterprises, and has promoted rapid development of electric power industry. If the density of $SF_6$ gas in the air chamber of high-voltage electrical equipment decreases and the moisture content exceeds the standard, the safe operation of $SF_6$ high-voltage electrical equipment will be seriously affected: 1) The decrease of $SF_6$ gas density to a certain extent will lead to the loss of insulation and arc extinguishing performance. 2) With the participation of some metals, $SF_6$ gas can hydrolyze with water at a temperature above 200° C., generate active HF and $SOF_2$, corrode insulating parts and metal parts and generate a lot of heat to increase the pressure of the air chamber. 3) When the temperature is reduced, excessive water may form condensed water, which significantly reduces the surface insulation strength of the insulating parts, and even causes flashover and serious harm. Therefore, the power grid operating procedure compulsively stipulates that the density of $SF_6$ gas and the water content should be tested regularly before and during operation of the equipment.

The networked and digital development of unattended substations and the increasingly rising requirements for remote control and telemetry are of vital practical significance for online monitoring of the gas density and the micro-water content of the SF6 electrical equipment. With the continuous rapid development of China's smart power grids, as an important component and key node of a smart substation, smart high-voltage and medium-voltage electrical equipment plays a pivotal role in the safety of the smart power grids.

SUMMARY

The invention aims to provide an electrical system (or electrical equipment) with an online sampling check function and a check method thereof, so as to solve the problems raised in the above background.

In order to achieve the above purpose, the invention adopts the following technical scheme:

According to a first aspect, this application provides an electrical system with an online sampling check function, comprising:
- electric equipment, in which an air chamber is arranged, and the air chamber is filled with insulating gas.
- a gas density relay, which is mounted outside the air chamber of the electrical equipment, or mounted outside the air chamber of the electrical equipment via the valve;
- a temperature regulating mechanism, which is a regulating mechanism capable of regulating temperature and configured to regulate temperature rise and fall of a temperature compensation element of the gas density relay body, so that the gas density relay body takes contact signal action;
- a gas density detection sensor, which is communicated with the gas density relay;
- an online check contact signal sampling unit, which is connected with the gas density relay and configured to sample contact signals generated when contacts of the gas density relay body take action;
- an intelligent control unit is respectively connected with the gas density detection sensor, the temperature regulating mechanism and the online check contact signal sampling unit and configured to complete control of the temperature regulating mechanism, pressure value acquisition, temperature value acquisition and/or gas density value acquisition and detecting contact signal operating values and/or return values of the gas density relay;

The contact signals include alarm signals and/or blocking signals.

Preferably, the electrical equipment includes SF6 gas electrical equipment, SF6 mixed gas electrical equipment, environmental protection gas electrical equipment, or other insulating gas electrical equipment.

Specifically, the electrical equipment includes a GIS, a GIL, a PASS, a circuit breaker, a current transformer, a voltage transformer, a transformer, an inflatable cabinet and a ring main unit.

Preferably, the electrical system comprises a support, the air chamber of the electrical equipment is located above or below the support, the support comprises a vertical frame and a horizontal frame, and the gas density relay is located in the internal accommodation space of the horizontal frame.

Preferably, the gas density relay includes but is not limited to a gas density relay of bimetallic strip compensation, a gas density relay of gas compensation, a gas density relay of hybrid compensation of bimetallic strips and gas; a completely mechanical gas density relay, a digital gas density relay, a mechanical and digital combined gas density relay; a gas density relay with a pointer displaying function, a digital display type gas density relay, a gas density switch without a displaying or indicating function; an SF6 gas density relay, an SF6 hybrid gas density relay and an N2 gas density relay.

Preferably, the gas density detection sensor is arranged on the gas density relay; alternatively, the temperature regulating mechanism is arranged inside or outside the gas density relay; alternatively, the gas density detection sensor, the online check contact signal sampling unit and the intelligent control unit are arranged on the gas density relay.

More preferably, the gas density relay and the gas density detection sensor are of an integrated structure; and preferably, the gas density relay and the gas density detection sensor are a remote gas density relay of an integrated structure.

Preferably, the gas density detection sensor is structurally integrated.

More preferably, the gas density detection sensor is a structurally integrated gas density transmitter; preferably, the online check contact signal sampling unit and the intelligent control unit are arranged on the gas density transmitter.

Preferably, the gas density detection sensor includes at least one pressure sensor and at least one temperature transducer; alternatively, the gas density detection sensor is the gas density transmitter comprising the pressure sensors and the temperature transducers; alternatively, the gas density detection sensor is a density detection sensor adopting a quartz tuning fork technology.

More preferably, a probe of the pressure sensor is mounted on a gas path of the gas density relay.

More preferably, probes of the temperature transducers are mounted on or outside the gas path of the gas density relay, or mounted in the gas density relay, or mounted outside the gas density relay.

More preferably, the temperature sensor may be a thermocouple, a thermistor, a semiconductor type, a contact type and a non-contact type, a thermal resistance and the thermocouple.

More preferably, the pressure sensor includes but is not limited to a relative pressure sensor and/or an absolute pressure sensor.

Further, the pressure sensor may be a diffusion silicon pressure sensor, an MEMS pressure sensor, a chip pressure sensor, a coil induction pressure sensor (such as a pressure sensor where a Bourdon tube is attached with an induction coil), a resistance pressure sensor (such as a pressure sensor where a Bourdon tube is attached with a slide wire resistance), an analog pressure sensor and a digital pressure sensor.

More preferably, at least one temperature transducer is arranged near the temperature compensation element of the gas density relay or on the temperature compensation element, or integrated in the temperature compensation element. Preferably, at least one temperature transducer is arranged at one end, close to the temperature compensation element, of a pressure detector of the gas density relay, wherein the pressure detector is a Bourdon tube or a bellow, and the temperature compensation element uses a temperature compensation sheet or gas sealed in a housing.

More preferably, the intelligent control unit compares ambient temperature values with temperature values collected by the temperature transducers to complete the check of the temperature transducers.

Preferably, the temperature regulation mechanism is a heating element; or the temperature regulation mechanism includes the heating element, a heat insulation element, a temperature controller, a temperature detector, and a temperature regulation mechanism outer shell; or the temperature regulation mechanism includes the heating element and the temperature controller; or the temperature regulation mechanism includes the heating element, a heating power regulator and the temperature controller; or the temperature regulation mechanism includes the heating element, a refrigeration element, the heating power regulator and the temperature controller; or the temperature regulation mechanism includes the heating element, the heating power regulator and a thermostatic controller; or the temperature regulation mechanism includes the heating element, the temperature controller, and the temperature detector; or the temperature regulation mechanism is the heating element, which is arranged near the temperature compensation element; or the temperature regulation mechanism is a miniature constant temperature box, wherein the number of the heating element is at least one, and the heating element includes but is not limited to one of a silicone rubber heater, a resistance wire, an electric heating tape, an electric heating rod, an air heater, an infrared ray heater element and a semiconductor; the temperature controller is connected to the heating element and used to control the heating temperature of the heating element, and the temperature controller includes but is not limited to one of a PID controller, a controller with PID combined with fuzzy control, an inverter controller and a PLC controller.

More preferably, the heating elements in the temperature regulating mechanism include at least two heating elements with the same power or different power, or include heating elements capable of regulating heating power.

More preferably, the positions of at least two heating elements can be the same or different, and the heating elements can be reasonably arranged as required.

Preferably, temperature rise and fall of the temperature regulation mechanism is in a multilevel control mode.

Preferably, temperature change speed per second approaching an operating value is not more than 1.0 DEG C. (or requirements are set as required) when the temperature regulating mechanism measures the contact signal operating value of the gas density relay through control of the intelligent control unit, namely, the temperature is required to rise or fall steadily.

Preferably, the electrical system with the online sampling check function further comprises a mutual self-check unit, and the intelligent control unit compares data detected by the mutual self-check unit, so that the gas density relay is free from maintenance; alternatively, the intelligent control unit and the mutual self-check unit compare the detected data, so that the gas density relay is free from maintenance.

Preferably, the intelligent control unit further comprises a depth calculation unit, and the depth calculation unit can provide a gas source suitable for checking an initial density for the gas density relay to be checked according to ambient temperature values, gas density values or pressure values of electrical equipment and gas pressure-temperature characteristics; alternatively, the intelligent control unit provides a gas source suitable for checking an initial density for the gas density relay to be checked according to ambient temperature values during check, gas pressure values of an air chamber of the electrical equipment, temperature values of the gas density relay to be checked and gas pressure-temperature characteristics.

Preferably, a connector communicated with the electrical equipment is arranged at one end of the valve, and the other end of the valve is communicated with the gas path of the gas density relay.

Preferably, the valve is connected with the intelligent control unit, and the valve is closed or opened under the control of the intelligent control unit.

Preferably, the valve is communicated with the electrical equipment through the connector.

Preferably, the valve is a valve with electrically motorized operation, and/or a solenoid valve.

More preferably, the valve is a permanent magnet solenoid valve.

Preferably, the valve is a piezoelectric valve or temperature control valve or novel valve made of intelligent memory materials and opened or closed in an electrical heating manner.

Preferably, the valve is closed or opened in a hose bending or clamping manner.

Preferably, the valve is sealed in a cavity or housing.

Preferably, pressure sensors are arranged on two sides of a gas path of the valve respectively; alternatively, pressure detectors are arranged on two sides of the gas path of the valve respectively.

Preferably, the electrical system further comprises a self-sealing valve which is mounted between the electrical equipment and the valve; alternatively, the valve is mounted between the electrical equipment and the self-sealing valve.

Preferably, the electrical system with the online sampling check function further comprises a pressure regulation mechanism, and a gas path of the pressure regulation mechanism is communicated with the gas density relay; the pressure regulation mechanism is further connected with the intelligent control unit, and regulates pressure rise and fall of the gas density relay under the control of the intelligent control unit to be matched and/or combined with the temperature regulation mechanism, so that the gas density relay takes contact action; alternatively, the electrical system further comprises a heating member, and the intelligent control unit is connected with the heating member; alternatively, the electrical system further comprises an air chamber and the heating member, the air chamber is communicated with the gas density relay, the heating member is arranged inside or outside the air chamber, and the intelligent control unit is connected with the heating member.

More preferably, the valve and the pressure regulation mechanism are sealed in a cavity or housing.

More preferably, the pressure regulating mechanism is sealed in a cavity or housing.

More preferably, during check, the pressure regulating mechanism is a closed air chamber, a heating element and/or a refrigeration element is arranged outside or inside the closed air chamber, heating is achieved through the heating element, and/or refrigeration is achieved through the refrigeration element, so that the temperature of gas in the closed air chamber is changed, and pressure rise and fall of the gas density relay is completed.

Further, the heating element and/or the refrigeration element are semiconductors.

Further, the pressure regulating mechanism further includes a heat insulation element, and the heat insulation element is arranged outside the closed air chamber.

More preferably, during check, the pressure regulation mechanism is a cavity with an opening at one end, and the other end of the cavity is communicated with the gas path of the gas density relay; a piston is arranged in the cavity, one end of the piston is connected with a regulating rod, the outer end of the regulating rod is connected with a drive part, the other end of the piston extends into the opening and hermetically contacts with the inner wall of the cavity, and the drive part drives the regulating rod to drive the piston to move in the cavity.

More preferably, during check, the pressure regulating mechanism is a closed air chamber, a piston is arranged in the closed air chamber, the piston hermetically contacts with the inner wall of the closed air chamber, and a drive part is arranged outside the closed air chamber and pushes the piston to move in the cavity through electromagnetic force.

More preferably, the pressure regulation mechanism is an airbag with one end connected with the drive part, the volume of the airbag is changed under drive of the drive part, and the airbag is communicated with the gas density relay.

More preferably, the pressure regulation mechanism is a bellow, one end of the bellow is communicated with the gas density relay, and the other end of the bellow extends and retracts under the drive of the drive part.

The drive part in the pressure regulating mechanism induces but is not limited to one of magnetic force, a motor (inverter motor or stepping motor), a reciprocating motion mechanism, a Carnot cycle mechanism and a pneumatic element.

More preferably, the pressure regulating mechanism is a deflation valve.

Further, the pressure regulating mechanism further includes a flow valve for controlling gas release flow.

Further, the deflation valve is a solenoid valve or valve with electrically motorized operation, or other valves for deflating by means of electricity or gas.

Further, the deflation valve deflates gas to zero, the intelligent control unit collects a current pressure value for comparison to complete zero check for the pressure sensor, and the intelligent control unit or background performs determination on the comparison result and issues, if the error is out of tolerance, an abnormal prompt: the pressure sensor is abnormal.

More preferably, the pressure regulating mechanism is a compressor.

More preferably, the pressure regulation mechanism is a pump, and the pump includes but is not limited to one of a pressure pump, a booster pump, an electrical gas pump and an electromagnetic gas pump.

More preferably, the gas density relay, the valve, and the pressure regulation mechanism are connected together by a connecting pipe.

Further, a gas path of the pressure regulation mechanism is communicated with a gas path of the gas density relay by a first connecting pipe; a gas outlet of the valve is directly communicated with the gas path of the gas density relay by a second connecting pipe, or the gas outlet of the valve is connected with the gas path of the pressure regulation mechanism by the second connecting pipe, so that the valve is communicated with the gas path of the gas density relay.

Preferably, the online check contact signal sampling unit and the intelligent control unit are arranged together.

More preferably, the online check contact signal sampling unit and the intelligent control unit are sealed in a cavity or housing.

Preferably, contact signals of the gas density relay are sampled by the online check contact signal sampling unit under the condition: the online check contact signal sampling unit has at least one group of independent sampling contacts, so that at least one contact can be automatically checked at the same time, continuous measurement is achieved without replacing the contacts or reselecting the contacts; each contact induces but is not limited to one of an alarm contact, an alarm contact+blocking contact, an alarm contact+blocking contact 1+blocking contact 2 and an alarm contact+blocking contact+overpressure contact.

Preferably, the testing voltage of the online check contact signal sampling unit for contact signal operating values or switching values of the gas density relay is not lower than 24V, namely, voltage not lower than 24V is applied between corresponding terminals of contact signals during check.

A contact of the gas density relay is a normally-open density relay, the online check contact signal sampling unit includes a first connecting circuit and a second connecting circuit, the first connecting circuit is connected with the contact of the gas density relay and a contact signal control loop, and the second connecting circuit is connected with the contact of the gas density relay and the intelligent control unit; under a non-check state, the second connecting circuit is open or isolated, and the first connecting circuit is closed; under a check state, the online check contact signal sampling unit cuts off the first connecting circuit, connects the second connecting circuit, and connects the contact of the gas density relay with the intelligent control unit; alternatively, a contact of the gas density relay is a normally-closed density relay, the online check contact signal sampling unit includes the first connecting circuit and the second connecting circuit, the first connecting circuit is connected with the contact of the gas density relay and the contact signal control loop, and the second connecting circuit is connected with the contact of the gas density relay and the intelligent control unit; under the non-check state, the second connecting circuit is open or isolated, and the first connecting circuit is closed; under the check state, the online check contact signal sampling unit closes the contact signal control loop, cuts off the connection between the contact of the gas density relay and the contact signal control loop, connects the second connecting circuit, and connects the contact of the gas density relay with the intelligent control unit.

More preferably, the first connecting circuit comprises a first relay, the second connecting circuit comprises a second relay, the first relay is provided with at least one normally-closed contact, the second relay is provided with at least one normally-open contact, and the normally-closed contact and the normally-open contact are kept in opposite on-off states; the normally-closed contact is connected in series to the contact signal control loop, and the normally-open contact is connected to a contact of the gas density relay; under the non-check state, the normally-closed contact is closed, the normally-open contact is open, and the gas density relay monitors output statuses of the contacts in real time; under the check state, the normally-closed contact is open, the normally-open contact is closed, and a contact of the gas density relay is connected with the intelligent control unit by means of the normally-open contact. When the contact is a normally-closed density relay, corresponding adjustments may be made.

Further, the first relay and the second relay may be two independent relays or the same relay.

Further, the first relay and the second relay may be two independent relays or the same relay. More preferably, the online check contact signal sampling unit is provided with a contact sampling circuit, the contact sampling circuit comprises a photocoupler and a resistor, and the photocoupler comprises a light-emitting diode and a phototriode; the light-emitting diode is connected in series with a contact of the gas density relay to form a closed loop; an emitter of the phototriode is grounded; a collector of the phototriode is connected to the intelligent control unit, and the collector of the phototriode is also connected with a power supply by means of the resistor;

when the contact is closed, the closed loop is powered on, the light-emitting diode emits light, the light turns on the phototriode, and the collector of the phototriode outputs a low level;

when the contact is open, the closed loop is powered off, the light-emitting diode does not emit light, the phototriode is cut off, and the collector of the phototriode outputs a high level.

More preferably, the online check contact signal sampling unit is provided with a contact sampling circuit, and the contact sampling circuit comprises a first photocoupler and a second photocoupler;

a light-emitting diode of the first photocoupler and a light-emitting diode of the second photocoupler are connected in parallel by current limiting resistors or directly, and then connected in series with contacts of the gas density relay to form a closed loop, and the light-emitting diodes of the first photocoupler and the second photocoupler are connected in opposite directions;

a collector of a phototriode of the first photocoupler and a collector of a phototriode of the second photocoupler are both connected to a power supply by means of voltage dividing resistors, an emitter of the phototriode of the first photocoupler and an emitter of the phototriode of the second photocoupler are connected to form an output end, and the output end is connected with the intelligent control unit and grounded by means of a resistor;

when the contact is closed, the closed loop is powered on, the first photocoupler is turned on, the second photocoupler is cut off, and the emitter of the phototriode of the first photocoupler outputs a high level; alternatively, the first photocoupler is cut off, the second photocoupler is turned on, and the emitter of the phototriode of the second photocoupler outputs a high level;

when the contact is open, the closed loop is powered off, both the first photocoupler and the second photocoupler are cut off, and the emitters of the phototriodes of the first photocoupler and the second photocoupler output a low level.

Further, the contact sampling circuit further comprises a first Zener diode group and a second Zener diode group, the first Zener diode group and the second Zener diode group are connected in parallel on the contact signal control loop, and the first Zener diode group and the second Zener diode group are connected in opposite directions; both the first Zener diode group and the second Zener diode group are composed of one, two or more Zener diodes connected in series. Alternatively, diodes can also be used instead of the Zener diodes.

Furthermore, the first Zener diode group comprises a first Zener diode and a second Zener diode connected in series, and a cathode of the first Zener diode is connected to an anode of the second Zener diode; the second Zener diode group comprises a third Zener diode and a fourth Zener diode connected in series, and an anode of the third Zener diode is connected to a cathode of the fourth Zener diode.

More preferably, the online check contact signal sampling unit is provided with a contact sampling circuit, and the contact sampling circuit comprises a first Hall current sensor and a second Hall current sensor; the first Hall current sensor, the second Hall current sensor and a contact of the gas density relay are connected in series to form a closed loop, and the contact of the gas density relay is connected between the first Hall current sensor and the second Hall current sensor; an output end of the first Hall current sensor and an output end of the second Hall current sensor are both connected to the intelligent control unit;

when the contact is closed, the closed loop is powered on, and current flows between the first Hall current sensor and the second Hall current sensor to generate an induced electromotive force;

when the contact is open, the closed loop is powered off, and no current flows between the first Hall current sensor and the second Hall current sensor to generate zero induced electromotive force.

More preferably, the online check contact signal sampling unit is provided with a contact sampling circuit, and the contact sampling circuit comprises: a first silicon controlled rectifier, a second silicon controlled rectifier, a third silicon controlled rectifier and a fourth silicon controlled rectifier;

the first silicon controlled rectifier and the third silicon controlled rectifier are connected in series, the second silicon controlled rectifier and the fourth silicon controlled rectifier are connected in series and then form a series-parallel closed loop together with a series circuit formed by the first silicon controlled rectifier and the third silicon controlled rectifier, one end of a contact of the gas density relay is electrically connected with the circuit between the first silicon controlled rectifier and the third silicon controlled rectifier by a line, and the other end is connected with the circuit between the second silicon controlled rectifier and the fourth silicon controlled rectifier by a line.

Further, a cathode of the first silicon controlled rectifier is connected with the intelligent control unit, and an anode of the first silicon controlled rectifier is connected with a cathode of the third silicon controlled rectifier; control electrodes of the first silicon controlled rectifier and the third silicon controlled rectifier are connected with the intelligent control unit; a cathode of the second silicon controlled rectifier is connected with the intelligent control unit, and an anode of the second silicon controlled rectifier is connected with a cathode of the fourth silicon controlled rectifier; and control electrodes of the second silicon controlled rectifier and the fourth silicon controlled rectifier are connected with the intelligent control unit.

Preferably, the intelligent control unit acquires gas density values collected by the gas density detection sensor; alternatively, the intelligent control unit acquires pressure values and temperature values collected by the gas density detection sensor, so that the gas density is online monitored by the gas density relay, namely, the gas density of the monitored electrical equipment is online monitored by the gas density relay.

More preferably, the intelligent control unit calculates the gas density values by an averaging method (mean value method). The averaging method includes: setting collection frequency at set time intervals, and averaging all collected N gas density values at different time points to obtain the gas density values; alternatively, averaging the density values corresponding to N different temperature values collected within the whole temperature range at set time intervals and set temperature interval step length to obtain the gas density values; alternatively, averaging the density values corresponding to N different pressure values collected within the whole pressure change range at set time intervals and set pressure interval step length to obtain the gas density values, wherein N is a positive integer larger than or equal to 1.

Preferably, the intelligent control unit acquires the gas density values collected by the gas density detection sensor when the gas density relay performs contact signal operating or switching, and online check of the gas density relay is achieved; alternatively, The intelligent control unit acquires the pressure value and temperature value collected by the gas density sensor when the contact signal of the gas density relay body is operated or switched, and converts them into the pressure value corresponding to 20° C. according to the gas pressure-temperature characteristics, that is, the gas density value, and completes the online check of the gas density relay.

Preferably, the gas density relay has relative density value output signals which are connected with the intelligent control unit; alternatively, the gas density relay has relative pressure value output signals which are connected with the intelligent control unit.

More preferably, when the gas density relay outputs relative density value output signals, the intelligent control unit collects a current gas density value for comparison to complete check on relative density values of the gas density relay, and the intelligent control unit or background performs determination on the comparison result and issues, if the error is out of tolerance, an abnormal prompt; alternatively, when the gas density relay outputs relative density value output signals, the intelligent control unit collects a current gas density value for comparison to complete mutual check on the gas density relay and the gas density detection sensor, and the intelligent control unit or background performs determination on the comparison result and issues, if the error is out of tolerance, an abnormal prompt; alternatively, when the gas pressure relay outputs relative pressure value output signals, the intelligent control unit collects a current pressure value for comparison to complete mutual check on the gas pressure relay and the gas pressure detection sensor, and the intelligent control unit or background performs determination on the comparison result and issues, if the error is out of tolerance, an abnormal prompt.

Preferably, the electrical system with the online sampling check function in the present application comprises at least two gas density detection sensors, and each gas density detection sensor comprises a pressure sensor and a temperature transducer; gas density values detected by the gas density detection sensors are compared to complete mutual check on the gas density detection sensors.

Preferably, the gas density detection sensor comprises at least two pressure sensors, and pressure values collected by the pressure sensors are compared to complete mutual check on the pressure sensors.

Preferably, the gas density detection sensor comprises at least two temperature transducers, and temperature values collected by the temperature transducers are compared to complete mutual check on the temperature transducers.

Preferably, the gas density sensor comprises at least one pressure sensor and at least one temperature transducer; the pressure value collected by each pressure sensor and the temperature value collected by each temperature transducer are randomly arranged and combined, and each combination is converted into multiple pressure values corresponding to 20° C. according to the gas pressure temperature characteristics, that is, the gas density value. Each gas density value is compared to complete the mutual check of each pressure sensor and each temperature transducer; alternatively, the pressure value collected by each pressure sensor and the temperature value collected by each temperature transducer are all arranged and combined, and each combination is converted into multiple pressure values corresponding to 20° C. according to the gas pressure temperature characteristics, that is, the gas density value. Each gas density value is compared to complete the mutual check of each pressure sensor and each temperature transducer; alternatively, the multiple gas density values obtained by each pressure sensor and temperature transducer are compared with the output signal of the gas density relay, to complete the mutual check of the gas density relay, pressure sensor and temperature transducer.

Preferably, after the gas density relay completes the check, the electrical system automatically generates a check report of the gas density relay, sends an alarm in case of abnormality, and uploads the check report to a far end or sends the check report to a designated receiver.

Preferably, based on an embedded algorithm and control program of an embedded system of a microprocessor, the intelligent control unit automatically controls the whole check process, including all peripherals, logic, input and output.

More preferably, based on embedded algorithms and control programs of a general computer, an industrial control computer, an ARM chip, an AI chip, a CPU, an MCU, an FPGA, a PLC, an industrial control main board, an embedded master control board and the like, the intelligent control unit automatically controls the whole check process, including all peripherals, logic, input and output.

Preferably, the intelligent control unit is provided with an electrical interface, which completes test data storage, and/or test data export, and/or test data printing, and/or data communication with an upper computer, and/or analog and digital information input.

More preferably, the electrical system supports input of basic information of the gas density relay, and the basic information includes but is not limited to one or more of factory numbers, precision requirements, rated parameters, manufacturers and operation positions.

Preferably, the intelligent control unit further includes a communication module for remote transmission of test data, and/or check results.

More preferably, the communication mode of the communication module is a wire communication or wireless communication mode.

Further, the wire communication mode includes but is not limited to one or more of an RS232 bus, an RS485 bus, a CAN-BUS bus, 4-20 mA, Hart, IIC, SPI, Wire, a coaxial cable, a PLC and a cable.

Further, the wireless communication mode includes but is not limited to one or more of NB-IOT, 2G/3G/4G/5G, WIFI, Bluetooth, Lora, Lorawan, Zigbee, infrared, ultrasonic waves, acoustic waves, satellites, optical waves, quantum communication and sonar.

Preferably, the intelligent control unit is further provided with a clock, and the clock is configured to regularly set the check time of the gas density relay, or record test time, or record event time.

Preferably, the intelligent control unit performs control through field control, and/or background control.

More preferably, the electrical system completes online check of the gas density relay according to settings or instructions of the background, or according to set check time of the gas density relay.

Preferably, circuits of the intelligent control unit include an intelligent control unit protection circuit, and the intelligent control unit protection circuit includes, but is not limited to one or more of an anti-static interference circuit (such as ESD, EMI), an anti-surge circuit, an electrical fast protection circuit, an anti-radio frequency field interference circuit, an anti-burst interference circuit, a power supply short-circuit protection circuit, a power supply reverse-connection protection circuit, an electrical contact misconnection protection circuit, and a charging protection circuit.

Preferably, the electrical system further comprises a multichannel joint, and the gas density relay, the valve and the pressure regulating mechanism are arranged on the multichannel joint; alternatively, the intelligent control unit is arranged on the multichannel joint.

More preferably, a gas path of the gas density relay is connected to a first joint of the multichannel joint; a gas path of the pressure regulating mechanism is connected to a second joint of the multichannel joint, and the first joint is connected to the second joint, so as to connect the gas path of the pressure regulating mechanism with the gas path of the gas density relay; a gas outlet of the valve is connected to a third joint of the multichannel joint, the third joint is connected to the first joint, so as to connect the gas outlet of the valve with the gas path of the pressure regulating mechanism and/or the gas path of the gas density relay.

Further, a connecting portion butted with the electrical equipment is provided at the third joint of the multichannel joint, and the valve is embedded in the connecting portion.

More preferably, the housing of the gas density relay is provided with a connector, and the connector is fixed in the air chamber of the electrical equipment; or, preferably, the housing of the gas density relay is fixed on the multichannel joint, and the multichannel joint is fixed in the air chamber.

Preferably, the electrical system further comprises an air admission interface.

More preferably, the air admission interface is arranged on the pressure regulating mechanism; alternatively, the air admission interface is arranged on the electrical equipment; alternatively, the air admission interface is arranged on the multichannel joint; alternatively, the air admission interface is arranged on the self-sealing valve.

More preferably, the electrical system is capable of counting the number of times, or the amount of, or the time of air admission.

Preferably, the electrical system can perform online air admission.

Preferably, the electrical system can perform online gas drying.

Preferably, the electrical system further comprises a display interface for human-machine interaction, and the display interface is connected with the intelligent control unit, displays current check data in real time, and/or supports data input. Specifically, the display includes real-time online gas density value display, pressure value display, temperature value display, change trend analysis, historical data query, real-time alarm, etc.

Preferably, the electrical system further includes micro-water sensors, which are respectively connected with the gas density relay and the intelligent control unit.

More preferably, the electrical system further includes a gas circulation mechanism, which is respectively connected with the gas density relay and the intelligent control unit and comprises a capillary tube, a seal chamber and a heating element, gas flow is achieved by heating with the heating element, and micro-water values inside the gas are monitored online.

Further, the micro-water sensors may be mounted in the seal chamber and the capillary tube of the gas circulation mechanism, at an orifice of the capillary tube or outside the capillary tube.

Preferably, the electrical system further includes decomposition product sensors, which are respectively connected with the gas density relay and the intelligent control unit.

Preferably, the electrical system further includes a camera for monitoring.

Preferably, the electrical system monitors online gas density values, or density values, pressure values and temperature values; alternatively, the electrical system remotely monitors gas density values, or density values, pressure values and temperature values.

Preferably, the electrical system has a self-diagnosis function, and can notify abnormalities in time, such as disconnection, short-circuit alarm, sensor damage, etc.

Preferably, the electrical system has a safety protection function: when a gas density value or a pressure value is less than a set value, the electrical system automatically stops check and sends out a notice signal.

Preferably, the electrical system is provided with a heater and/or a radiator (e.g., a fan), the heater is turned on when the temperature is less than a set value, and the radiator (e.g., a fan) is turned on when the temperature is higher than the set value.

Preferably, the gas density relay also includes a contact resistance detection unit, which is connected with the contact signal or directly connected with the signal generator in the gas density relay. Under the control of the online check contact signal sampling unit, the contact signal of the gas density relay is isolated from its control loop. When the contact signal of the gas density relay moves and/or when the contact signal of the gas density relay receives the instruction to detect the contact resistance, the contact resistance detection unit can detect the contact resistance value of the contact point of the gas density relay.

Preferably, the gas density relay further comprises an insulating resistance detection unit, and the insulating resistance detection unit is connected with contacts or directly connected with the signal generator in the gas density relay; the contacts of the gas density relay are isolated from the control loop of the relay under the control of the online check contact signal sampling unit, and the insulating resistance detection unit can detect insulating resistance values of contacts of the gas density relay when the contacts of the gas density relay take actions and/or instructions for detecting insulating resistance of the contacts are received, and then detect the insulating performance of the gas density relay.

Preferably, at least two gas density relays, at least two multichannel joints, at least two temperature regulating mechanisms, at least two online check contact signal sampling units, one intelligent control unit and one gas density detection sensor complete online check of the gas density relay; alternatively,
  at least two gas density relays, at least two multichannel joints, at least two temperature regulating mechanisms, at least two online check contact signal sampling units, at least two intelligent control units and one gas density detection sensor complete online check of the gas density relay; alternatively,
  at least two gas density relays, at least two multichannel joints, at least two temperature regulating mechanisms, at least two online check contact signal sampling units, at least two gas density detection sensors and one intelligent control unit complete online check of the gas density relay.

In the second aspect, the present application provides a gas density relay check method, which includes:
  in a normal working state, the gas density relay monitors the gas density value in the electrical equipment;
  The intelligent control unit or the gas density relay performs operations according to the set check time and/or check instructions, gas density values and/or temperature values, under the condition of allowing and/or checking the gas density relay:
    The intelligent control unit controls the temperature regulation mechanism, so that the temperature of the gas density relay rises, then the temperature of the temperature compensation element of the gas density relay rises, the gas density relay takes contact action, the contact action is transmitted to the intelligent control unit via the online check contact signal sampling unit, and the intelligent control unit acquires a gas density value according to the pressure value and the temperature value in the contact action, or acquires the gas density value directly, and detects the contact signal operating value of the gas density relay, to complete the check of the contact signal operating value of the gas density relay;
  Upon completion of check of all contact signals, the intelligent control unit shuts off the heating element of the temperature regulating mechanism.

Preferably, the gas density relay check method includes:
  in a normal working state, the gas density relay monitors the gas density value in the electrical equipment, and at the same time, the gas density relay monitors the gas density value in the electrical equipment online via a gas density detection sensor and the intelligent control unit;
  The intelligent control unit or the gas density relay performs operations according to the set check time and/or check instructions, gas density values and/or temperature values, under the condition of allowing and/or checking the gas density relay:
    The intelligent control unit adjusts the online check contact signal sampling unit into a check state, the online check contact signal sampling unit cuts off the control loop of contact signals of the gas density relay in the check state, and contacts of the gas density relay are connected to the intelligent control unit;
    The intelligent control unit controls the temperature regulation mechanism, so that the temperature of the gas density relay rises, then the temperature of the temperature compensation element of the gas density relay rises, the gas density relay takes contact action, the contact action is transmitted to the intelligent control unit via the online check contact signal sampling unit, and the intelligent control unit acquires a gas density value according to the pressure value and the temperature value in the contact action, or acquires the gas density value directly, and detects the contact signal operating value of the gas density relay, to complete the check of the contact signal operating value of the gas density relay;
    The intelligent control unit controls the temperature regulation mechanism, so that the temperature of the gas density relay is reduced, then the temperature of the temperature compensation element of the gas density relay is reduced, contact reset occurs to the gas density relay, and the contact reset is transmitted to the intelligent control unit via the online check contact signal sampling unit; the intelligent control unit acquires a gas density value according to the pressure value and the temperature value in the contact reset, or acquires the gas density value directly, and detects the contact signal return value of the gas density relay, to complete the check of the contact signal return value of the gas density relay;
    After the check of all the contact signals is completed, the intelligent control unit turns off the heating element of the temperature regulation mechanism, and adjusts the online check contact signal sampling unit into a working state, and the control loop of the contact signals of the gas density relay is recovered to a normal working state.

Preferably, the gas density relay further comprises a pressure regulating mechanism, and a gas path of the pressure regulating mechanism is communicated with a gas path of the gas density relay; the check method for the gas density relay further comprises:

in a normal working state, the gas density relay monitors the gas density value in the electrical equipment;

The intelligent control unit or the gas density relay performs operations according to the set check time and/or check instructions, gas density values and/or temperature values, under the condition of allowing and/or checking the gas density relay:

The valve is closed via the intelligent control unit;

The intelligent control unit drives the pressure regulation mechanism to reduce gas pressure slowly, the intelligent control unit controls the temperature regulation mechanism to raise the temperature of the gas density relay, then the temperature of the temperature compensation element of the gas density relay rises, the gas density relay takes contact action, the contact action is transmitted to the intelligent control unit via the online check contact signal sampling unit, and the intelligent control unit acquires a gas density value according to the pressure value and the temperature value in the contact action, or acquires the gas density value directly, and detects the contact signal operating value of the gas density relay, to complete the check of the contact signal operating value of the gas density relay;

When the check of all the contact signals is completed, the intelligent control unit opens the valve and shuts off the heating element of the temperature regulating mechanism.

Preferably, the gas density relay further comprises a pressure regulating mechanism, and a gas path of the pressure regulating mechanism is communicated with a gas path of the gas density relay; the check method for the gas density relay further comprises:

in a normal working state, the gas density relay monitors the gas density value in the electrical equipment, and at the same time, the gas density relay monitors the gas density value in the electrical equipment online via a gas density detection sensor and the intelligent control unit;

The intelligent control unit or the gas density relay performs operations according to the set check time and/or check instructions, gas density values and/or temperature values, under the condition of allowing and/or checking the gas density relay:

The valve is closed via the intelligent control unit;

The intelligent control unit adjusts the online check contact signal sampling unit into a check state, the online check contact signal sampling unit cuts off the control loop of contact signals of the gas density relay in the check state, and contacts of the gas density relay are connected to the intelligent control unit;

The intelligent control unit controls the temperature regulation mechanism to increase the temperature of the gas density relay, then the temperature of the temperature compensation element of the gas density relay rises, the intelligent control unit drives the pressure regulation mechanism to reduce gas pressure slowly, the gas density relay takes contact action, the contact action is transmitted to the intelligent control unit via the online check contact signal sampling unit, and the intelligent control unit acquires a gas density value according to the pressure value and the temperature value in the contact action, or acquires the gas density value directly, and detects the contact signal operating value of the gas density relay, to complete the check of the contact signal operating value of the gas density relay;

The intelligent control unit controls the temperature regulation mechanism to reduce the temperature of the gas density relay, then the temperature of the temperature compensation element of the gas density relay is reduced, the intelligent control unit drives the pressure regulation mechanism to increase gas pressure slowly, contact reset occurs to the gas density relay, the contact reset is transmitted to the intelligent control unit via the online check contact signal sampling unit, and the intelligent control unit acquires a gas density value according to the pressure value and the temperature value in the contact reset, or acquires the gas density value directly, and detects a contact signal return value of the gas density relay, to complete the check of the contact signal return value of the gas density relay;

After the check of all the contact signals is completed, the intelligent control unit opens the valve, shuts off the heating element of the temperature regulation mechanism, and adjusts the online check contact signal sampling unit into a working state, and the control loop of the contact signals of the gas density relay is recovered to a normal working state.

Preferably, the gas density relay check method includes:

in a normal working state, the gas density relay monitors the gas density value in the electrical equipment, and at the same time, the gas density relay monitors the gas density value in the electrical equipment online via a gas density detection sensor and the intelligent control unit;

The intelligent control unit or the gas density relay performs operations according to the set check time and/or check instructions, gas density values and/or temperature values, under the condition of allowing and/or checking the gas density relay:

The intelligent control unit adjusts the contact signal sampling unit into a check state, the contact signal sampling unit cuts off the control loop of contact signals of the gas density relay in the check state, and contacts of the gas density relay are connected to the intelligent control unit;

The intelligent control unit controls the temperature regulation mechanism to increase the temperature of gas in the gas density relay, and the intelligent control unit closes the valve after the temperature reaches a set value After the temperature or pressure of gas in the gas density relay falls to a set value, the intelligent control unit controls the temperature regulation mechanism to increase the temperature of the gas density relay, then the temperature of the temperature compensation element of the gas density relay rises, a contact action occurs to the gas density relay, the contact action is transmitted to the intelligent control unit via the contact signal sampling unit, and the intelligent control unit obtains a gas density value according to the pressure value and the temperature value in the contact action, or obtains the gas density value directly, and detects the contact signal operating value of the gas density relay, to complete the check of the contact signal operating value of the gas density relay;

When the check of all the contact signals is completed, the intelligent control unit opens the valve and shuts off the temperature regulating mechanism.

Preferably, the gas density relay further comprises an air chamber and a heating member, the air chamber is connected with gas density relay, and the heating member is arranged outside or inside the air chamber; the check method for the gas density relay further comprises:

in a normal working state, the gas density relay monitors the gas density value in the electrical equipment, and at the same time, the gas density relay monitors the gas density value in the electrical equipment online via a gas density detection sensor and the intelligent control unit;

The intelligent control unit or the gas density relay performs operations according to the set check time and/or check instructions, gas density values and/or temperature values, under the condition of allowing and/or checking the gas density relay:

The intelligent control unit adjusts the contact signal sampling unit into a check state, the contact signal sampling unit cuts off the control loop of contact signals of the gas density relay in the check state, and contacts of the gas density relay are connected to the intelligent control unit;

The intelligent control unit controls the heating member to heat so as to change the temperature of gas in the air chamber between the valve and the gas density relay, and after the temperature reaches a set value, the intelligent control unit closes the valve and shuts off the heating member;

After the temperature or pressure of the air chamber falls to a set value, the intelligent control unit controls the temperature regulation mechanism to increase the temperature of the gas density relay, then the temperature of the temperature compensation element of the gas density relay rises, a contact action occurs to the gas density relay, the contact action is transmitted to the intelligent control unit via the contact signal sampling unit, and the intelligent control unit obtains a gas density value according to the pressure value and the temperature value in the contact action, or obtains the gas density value directly, and detects the contact signal operating value of the gas density relay, to complete the check of the contact signal operating value of the gas density relay;

When the check of all the contact signals is completed, the intelligent control unit opens the valve and shuts off the temperature regulating mechanism.

Preferably, the gas density relay or electrical system also include the air chamber and the heating member, the air chamber is connected with gas density relay, and the heating member is placed outside or inside the air chamber; check method of the gas density relay also include:

in a normal working state, the gas density relay monitors the gas density value in the electrical equipment, and at the same time, the gas density relay monitors the gas density value in the electrical equipment online via a gas density detection sensor and the intelligent control unit;

The intelligent control unit or the gas density relay performs operations according to the set check time and/or check instructions, gas density values and/or temperature values, under the condition of allowing and/or checking the gas density relay:

The intelligent control unit adjusts the contact signal sampling unit into a check state, the contact signal sampling unit cuts off the control loop of contact signals of the gas density relay in the check state, and contacts of the gas density relay are connected to the intelligent control unit;

The intelligent control unit is used to control heating by the heating member, which leads to change in temperature of gas in air chamber. Use the intelligent control unit to shut off the valve after reaching the set value, and then use intelligent control unit to turn off the heating member;

After the temperature or pressure of the air chamber falls to a set value, the intelligent control unit controls the temperature regulation mechanism to increase the temperature of the gas density relay, then the temperature of the temperature compensation element of the gas density relay rises, a contact action occurs to the gas density relay, the contact action is transmitted to the intelligent control unit via the contact signal sampling unit, and the intelligent control unit obtains a gas density value according to the pressure value and the temperature value in the contact action, or obtains the gas density value directly, and detects the contact signal operating value of the gas density relay, to complete the check of the contact signal operating value of the gas density relay;

When the check of all the contact signals is completed, the intelligent control unit opens the valve and shuts off the temperature regulating mechanism.

More preferably, a gas density relay check method include:

Upon completion of check of contact signal operating value of the gas density relay, intelligent control unit is used to reduce temperature of the gas density relay through control over temperature regulating mechanism, and thus reduce temperature of the temperature compensation unit of gas density relay, which leads to contact reset of the gas density relay. Contact reset will be transferred to intelligent control unit through the contact signal sampling unit, the intelligent control unit will get gas density value based on pressure value and temperature value at the time of contact reset, or directly get gas density value, detect contact signal return value of the gas density relay, and finish check of contact signal return value of the gas density relay;

Upon completion of check of all contact signals, the intelligent control unit will open the valve and turn off temperature regulating mechanism, and adjust contact signal sampling unit to operating state. Control loop of contact signal of the gas density relay will return to normal operating state.

Preferably, the contact signals include alarm signals and/or blocking signals.

Preferably, the gas density detection sensor includes at least one pressure sensor and at least one temperature transducer; alternatively, the gas density detection sensor is the gas density transmitter comprising the pressure sensors and the temperature transducers; alternatively, the gas density detection sensor is a density detection sensor adopting a quartz tuning fork technology.

Preferably, the gas density relay can send alarm automatically in case of abnormality upon completion of check, and upload to remote or send to designated receiver.

Preferably, the check method further includes: displaying gas density values and check results in field or displaying the gas density values and the check results through the background.

Preferably, the check method further includes: the intelligent control unit performs control through field control, and/or background control.

Preferably, the check method shall have at least two gas density relays, at least two multichannel joints, at least two temperature regulating mechanisms, at least two online check contact signal sampling unit as well as a intelligent control unit and a gas density detection sensor to complete online check of the gas density relay; or at least two gas density relays, at least two multichannel joints, at least two temperature regulating mechanisms, at least two online check contact signal sampling units, at least two intelligent control units and one gas density detection sensor complete online check of the gas density relay; alternatively, at least two gas density relays, at least two multichannel joints, at least two temperature regulating mechanisms, at least two online check contact signal sampling units, at least two gas density detection sensors and one intelligent control unit complete online check of the gas density relay.

Compared with the prior art, the technical scheme of the invention has the following advantages:

This application provides a electrical system with online sampling check function and its check method for high voltage electrical device, which include the electrical equipment, the gas density relay, the gas density detection sensor, the temperature regulating mechanism, the valve, the online check contact signal sampling unit and the intelligent control unit. Intelligent control unit is used to shut off the valve to isolate the gas density relay from the electrical equipment on gas path; regulate temperature rise and fall of the temperature compensation element of the gas density relay through temperature regulating mechanism, which leads to contact action of gas density relay. Contact action is transferred to the intelligent control unit through the online check contact signal sampling unit, and the intelligent control unit detects alarm of gas density relay and/or operating value and/or return value of blocking contact signal based on density value at the time of contact action. Disassembly-free check of density relay can be realized without adding density relay disassembly-free check valve, and gas density relay check can be completed without maintainer at the site, which can improve reliability of power grid, increase work efficiency and reduce operating and maintenance cost.

BRIEF DESCRIPTION OF THE DRAWINGS

Drawings for constituting a part of the present application are used to provide further understanding of the present application, and exemplary embodiments of the present application and descriptions thereof are used to explain the present application, and do not constitute improper limitation to the present application. In the drawings.

DETAILED DESCRIPTION OF THE EMBODIMENTS

In order to make the purpose, the technical scheme and the advantages of the invention more clear and definite, the invention is further elaborated hereafter with reference to the drawings and examples. It should be understood that the specific embodiments described herein are only used to explain the invention, and cannot play a role in limiting the invention.

Embodiment I

Figure 1:
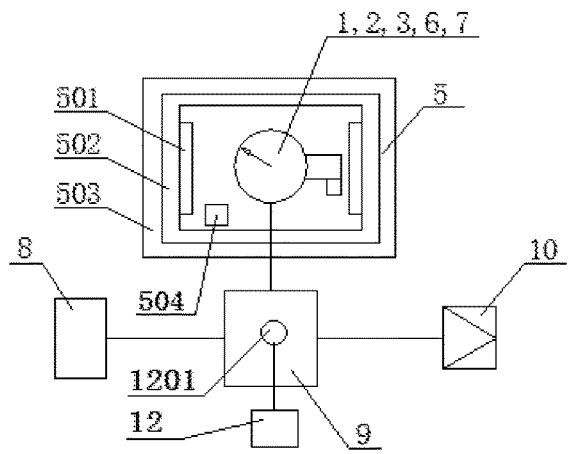
FIG. 1 is structural diagram of electrical system with online sampling check function of embodiment 1.

As indicated in FIG. 1, embodiment 1 of this invention provides an electrical system with online sampling check function, which include: the electric equipment 8, the gas density relay 1, the pressure sensor 2, the temperature transducer 3, the temperature regulating mechanism 5, the online check contact signal sampling unit 6, the intelligent control unit 7, the multichannel joint 9, the air admission interface 10 and the trace moisture sensor 12. The gas density relay 1, the trace moisture sensor 12 and the air admission interface 10 are placed on multichannel joint. The probe 1201 of the trace moisture sensor 12 is placed on air duct between electric equipment 8 and the air admission interface 10; the gas density relay 1, the pressure sensor 2, the temperature transducer 3, the online check contact signal sampling unit 6 and the intelligent control unit 7 are placed together. The temperature regulating mechanism 5 and the gas density relay 1 are placed correspondingly, and the temperature transducer 3 is placed in the housing of the gas density relay 1. The pressure sensor 2, the online check contact signal sampling unit 6 and the intelligent control unit 7 can be placed on gas density relay 1. The temperature regulating mechanism 5 is placed outside the gas density relay 1. To be specific, the gas density relay is connected with electric equipment 8 by the multichannel joint; the pressure sensor 2 is connected with gas density relay 1 on gas path; the online check contact signal sampling unit 6 is connected with the gas density relay 1 and the intelligent control unit 7 respectively; the pressure sensor 2, the temperature transducer 3 and the temperature regulating mechanism 5 are connected with the intelligent control unit 7 respectively; and the air admission interface 10 is connected with the multichannel joint 9.

The electric equipment 8 got air chamber inside, and the air chamber is filled with insulating gas. The multichannel joint 9 is sealed and connected to the electric equipment 8, and it's connected with air chamber of electric equipment 8. The electric equipment 8 is connected with the gas density relay 1 by the multichannel joint 9.

The temperature regulating mechanism 5 is configured to regulate temperature rise and fall of the temperature compensation element of the gas density relay 1; the online check contact signal sampling unit 6, which is connected with the gas density relay 1, is configured to sample contact signals of the gas density relay 1; where the contact signals include alarm and/or blocking; and the temperature regulating mechanism 5 mainly consists of the heating element 501, the heat insulation element 502, the controller 504, the temperature detector 3 (the same to temperature transducer) and the housing of temperature regulating mechanism 503. The controller 504 may use PID control, or control mode of PID in combination of fuzzy control. The range of the electric heating working power of the heating element 501 is controlled by controller 504 and the set value of the temperature rise and fall amplitude, and change amplitude of the temperature is controlled by different power levels. A degree of deviation may be set, so as to heat or refrigerate in advance. In case of temperature in temperature regulating mechanism 5, during measurement of operating value of contact signal of gas density relay 1, the temperature change rate shall be no greater than 1.0° C./s when it's close to operating value (even no greater than 0.5° C./s, or set such requirement as required), i.e. temperature needs to rise or fall stably.

Its operating principles are as follows:

Operate or control temperature regulating mechanism by intelligent control unit 7, rise temperature of gas density relay 1, and thus rise temperature of gas density relay 1. The temperature change rate shall be no greater than 1.0° C./s when it's close to operating value (even no greater than 0.5° C./s, or set such requirement as required), i.e. temperature needs to rise (or fall) stably. Upon occurrence of contact action at gas density relay 1, the contact action's transferred to intelligent control unit 7 through online check contact signal sampling unit 6, the intelligent control unit 7 obtains gas density value based on pressure value and temperature value at the time of contact action or directly obtains gas density value detects operating value of contact signal of gas density relay 1, and thus completes the check of operating value of contact signal of gas density relay 1. For instance, in case of gas density rely with density relay parameters of 0.6/0.52/0.50 MPa (rated value of 0.6 MPa/alarm pressure value of 0.52 MPa/alarm pressure value of 0.50 MPa, relative pressure), when ambient temperature is 5° C., gas pressure of the gas chamber of electric equipment 8 is 0.5562 MPa (relative pressure), and pressure value in the checking system remains unchanged at this time. The alarm contact acts when temperature rises to 29.5° C., and intelligent control unit 7 can obtain gas density relay alarm contact operating value of 0.5317 MPa (relative pressure) based on pressure value of 0.5562 MPa (relative pressure) and the temperature value of 29.5° C. at the time of contact action, then intelligent control unit 7 can obtain error of operating value of alarm contact: 0.0117 MPa (0.5317 MPa-0.52 MPa=0.0117 MPa), and thus complete the check of operating value of alarm contact of the gas density relay.

Use intelligent control unit 7 to operate or control temperature regulating mechanism 5, reduce temperature of gas density relay 1, and thus reduce temperature of temperature compensation element of gas density relay 1, which leads to contact reset of gas density relay 1. Contact reset is transferred to intelligent control unit 7 through contact signal sampling unit, intelligent control unit 7 obtains gas density value based on pressure value and temperature value at the time of contact reset or directly obtains gas density value, detects return value of contact signal of gas density relay 1, and thus completes check of return value of contact signal of gas density relay. For instance, in case of gas density rely with density relay parameters of 0.6/0.52/0.50 MPa (rated value of 0.6 MPa/alarm pressure value of 0.52 MPa/alarm pressure value of 0.50 MPa, relative pressure), when ambient temperature is 5° C., gas pressure inside electric equipment 8 is 0.5562 MPa (relative pressure), and pressure value in the checking system remains unchanged at this time. Contact reset of alarm contact occurs when temperature drops to 24.8° C., and intelligent control unit 7 can obtain gas density relay alarm contact return value of 0.5435 MPa (relative pressure) based on pressure value of 0.5562 MPa (relative pressure) and temperature value of 24.8° C. at the time of contact reset, then intelligent control unit 7 can obtain pressure difference of alarm contact: 0.0118 MPa (0.5435 MPa-0.5317 MPa=0.0118 MPa), and thus complete the check of operating value of alarm contact of gas density relay 1. According to the requirements and the check results (check data), the intelligent control unit 7 can judge the performance of the checked gas density relay (qualified or unqualified).

Upon completion of check of all contact signals, the intelligent control unit 7 will shut off heating element 501 of temperature regulating mechanism 5.

Figure 2:
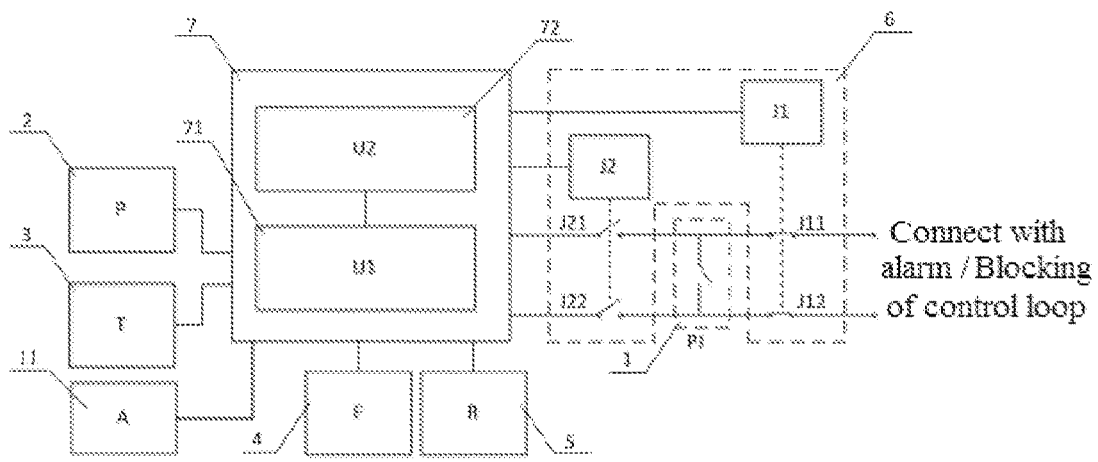
FIG. 2 is control circuit diagram of electrical system of embodiment 1.

FIG. 2 is control circuit schematic diagram of a electrical system with online sampling check function of embodiment 1. As indicated in Diagram 2, online check contact signal sampling unit 6 of this embodiment has protective circuits, which include first connecting circuit and second connecting circuit. The first connecting circuit is connected with contact of the gas density relay 1 and contact signal control loop, and the second connecting circuit is connected with contact of the gas density relay 1 and the intelligent control unit 7. Under non-check state, the second connecting circuit is open, and the first connecting circuit is closed; under check state, the online check contact signal sampling unit 6 will cut off the first connecting circuit, connect the second connecting circuit, and connect contact of the gas density relay 1 with the intelligent control unit 7.

To be specific, the first connecting circuit include the first relay J1, and the second connecting circuit include the second relay J2. The first relay J1 has normally closed contacts of J11 and J12, and the normally closed contacts of J11 and J12 are connected in series of contact signal control loop; the second relay J2 has normally open contacts of J21 and J22, and the normally open contacts of J21 and J22 are connected to contact PJ; the first relay J1 and the second relay J2 can be also integrated, i.e. a relay with both normally open and normally closed contacts. under the non-check state, the normally closed contacts of J11 and J12 are closed, the normally open contacts of J21 and J22 are open, and the gas density relay 1 monitors output statuses of the contact $P_J$ in real time; under the check state, the normally closed contacts of J11 and J12 are open, the normally open contacts of J21 and J22 are closed, and contact PJ of the gas density relay 1 is connected with the intelligent control unit 7 by the normally open contacts of J21 and J22.

The intelligent control unit 7 is connected with the air density detection sensors (pressure sensor 2 and temperature transducer 3), the temperature regulating mechanism 5 and the online check contact signal sampling unit 6 respectively, which are configured to complete control over the temperature regulating mechanism 5, collection of pressure value, temperature value and/or gas density value as well as detection of contact signal operating value and/or contact signal return value of the gas density relay. The intelligent control unit 7 mainly consists of processor 71(U1) and power supply 72 (U2). The processor 71 (U1) GPC, industrial control computer, CPU, single chip microcomputer, ARM chip, AI chip, MCU, FPGA, PLC, industrial control main board, embedded master control board and other intelligent integrated circuits. The power supply 72(U2) can be switching power supply, 220V AC, DC power supply, LDO, programmable power supply, solar energy, storage battery, rechargeable battery and battery. The pressure sensor 2 of pressure collection system P can be: pressure sensor, pressure transmitter and other pressure sensing elements. The temperature transducer 3 of temperature collection system T can be temperature transducer, temperature transmitter and other temperature sensing elements, or thermocouple, thermistor, semiconductor, or contact and non-contact, or thermal resistance and thermocouple, or digital and analog, such as DS18B20 and PT100. The temperature regulating mechanism 5 is heating element; or, the temperature regulating mechanism mainly consists of the heating element, the heat insulation element, the temperature controller, the temperature detector and the temperature regulating mechanism housing; or the temperature regulating mechanism mainly consists of the heating element and them temperature controller; where the temperature controller include one of a PID controller, a controller with PID combined with fuzzy control, an inverter controller, and a PLC controller.

Operating Principles:

The intelligent control unit 7 monitors the gas pressure P and temperature T of the electrical equipment with pressure sensor 2 and temperature transducer 3, and obtains the pressure value $P_{20}$ (i.e. gas density value) under the corresponding temperature of 20° C. When the gas density relay 1 needs to be checked, if gas density value $P_{20} \geq$ the set safety check density value $P_S$.

Then the intelligent control unit 7 disconnects the contact signal control loop of the gas density relay 1, i.e. normally closed contacts of J11 and J12 of the first relay J1 of the online check contact signal sampling unit 6 are disconnected, which prevents impact on safe operation of the electrical equipment 8 during online check of the gas density relay 1, sending of alarm signal by mistake during the check or blocking of control circuit. Since monitoring and judgement that prove gas density value $P_{20}$ is greater than or equal to the set safety check density value PS have been conducted prior to start of the check, gas of the electrical equipment 8 is within the range of safe operation, and gas leakage is a slow process, so it's safe during the check. Meanwhile, the intelligent control unit 7 connects contact sampling circuit of the contact of gas density relay 1, i.e. normally open contacts of J21 and J22 of the second relay J2 of the online check contact signal sampling unit 6 are closed, and the contact $P_J$ of the gas density relay 1 is connected with the intelligent control unit 7 by the normally open contacts of J21 and J22 of the second relay J2 at this time.

After that, operate or control temperature regulating mechanism by the intelligent control unit 7, rise temperature of the gas density relay 1, and thus rise temperature of the temperature compensation element of the gas density relay 1. The temperature change rate shall be no greater than 1.0° C./s when it's close to operating value (even no greater than 0.5° C./s, or set such requirement as required), i.e. temperature needs to rise stably. Upon occurrence of contact action at the gas density relay 1, the contact signal action's transferred to the intelligent control unit 7 through the second relay J2 of the online check contact signal sampling unit 6, and the intelligent control unit 7 can detect contact operating value $P_{D20}$ of the gas density relay based on pressure value P and temperature value T measured at the time of contact signal action by converting them into corresponding pressure value P20 (density value) at 20° C. based on gas characteristics. Upon detection of all contact signal operating values of the alarm and/or blocking signal of the gas density relay 1, the intelligent control unit 7 is used to operate or control the temperature regulating mechanism 5, reduce temperature of the gas density relay 1, and thus reduce temperature of the temperature compensation element of the gas density relay 1, which leads to contact reset of the gas density relay as well as detection of return value of alarm and/or blocking contact signal of the gas density relay 1. The mean value is calculated upon repeated checks for several times (such as 2-3 times), and thus the check of the gas density relay is completed.

Upon completion of the check, the normally open contacts of J21 and J22 of the second relay J2 of the online check contact signal sampling unit 6 are disconnected, and contact $P_J$ of gas density relay 1 is disconnected to the intelligent control unit 7 through disconnection of the normally open contacts of J21 and J22 of the second relay J2 at this time. The intelligent control unit 7 is used to shut off the heating element 501 of the temperature regulating mechanism 5. Then the normally closed contacts of J11 and J12 of the first relay J1 of the online check contact signal sampling unit 6 are closed, contact signal control loop of the gas density relay 1 works normally, and the gas density relay monitors gas density of the electrical equipment 8 in a safe manner, which ensures safe and reliable operation of the electrical equipment 8. It can facilitate completion of online check of the gas density relay without causing impact on safe operation of the electrical equipment 8.

Upon completion of check by the gas density relay 1 (or density monitoring device), the electrical system can make judgement and display detection result. A way thereof is flexible. Specifically: 1) the electrical system may notify the test result locally, for example, display the test result via an indicator light, a digital display, or a liquid crystal display; 2) or upload the test result via an online remote communication, for example, upload the test result to a background; 3) or upload the test result wirelessly to a specific terminal, for example, upload the test result wirelessly to a mobile phone; 4) or upload the test result via other channels; 5) or upload an abnormal result via an alarm signal wire, or a special signal wire; 6) or upload the abnormal result separately, or upload the abnormal result bundled with other signals. In short, after the electrical system completes the online check of the gas density relay 1, if an abnormality is provided, the electrical system may automatically send an alarm, may upload the abnormality to a distal end, or may send the abnormality to a designated receiver, such as the mobile phone. Alternatively, after the check is completed, if any abnormality is provided, the intelligent control unit 7 may upload the abnormality to the distal end (a monitoring room, a background monitoring platform, etc.) via an alarm contact signal of the gas density relay 1, and may also display and notify the abnormality locally. For a simple version of the online check, a check result with the abnormality may be uploaded by the alarm signal wire. The abnormal check result can be uploaded regularly. If an abnormality is provided, a contact is connected to the alarm signal contact in parallel to be closed and disconnected regularly, and the condition can be obtained via analysis; or abnormal check result is uploaded by the independent check signal line. Specifically, the upload may be performed for a good state or a problem, or the check result is uploaded by a separate check signal wire, or locally displayed, locally alarmed, uploaded wirelessly, or uploaded in networking with a smartphone. The communication way is wire or wireless, the wire communication way may be RS232, RS485, CAN-BUS and other industrial buses, optical fiber ethernet, 4-20 mA, Hart, IIC, SPI, Wire, a coaxial cable, an PLC power line carrier, etc. The wireless communication way may be 2G/3G/4G/5G, WIFI, Bluetooth, Lora, Lorawan, Zigbee, infrared, ultrasonic, acoustic, satellite, light wave, quantum communication, sonar, a sensor built-in 5G/NB-iot communication module (such as NB-iot), etc. In short, a plurality of ways and a plurality of combinations may be provided to ensure the reliable performance of the gas density relay completely.

The gas density relay has the function of safety protection. That is, when a gas density value is less than a setting value, the gas density relay automatically stops the online check of the gas density relay 1 and sends out a notice signal. For example, when the gas density value is less than the setting value $P_S$, the check is not performed again. Only when the gas density value is greater than or equal to (an alarm pressure value +0.02 MPa), the online check may be performed.

The electrical system may perform the online check according to a setting time, or perform the online check according to a setting temperature (such as an extreme high temperature, a high temperature, an extreme low temperature, a low temperature, a normal temperature, 20° C., etc.). The error judgment requirements are different for online check at high temperature, low temperature, normal temperature and 20° C. ambient temperature. For example, for check at 20° C. ambient temperature, the accuracy requirements of gas density relay can be level 1.0 or 1.6, or level 2.5 at high temperature. Specifically, it can be implemented according to the temperature requirements and the related standards. For example, according to the regulations of the temperature compensation performance in article 4.8 of DL/T 259 Calibration Regulation for SF6 Gas Density Monitor, and the precision requirement corresponding to each temperature value.

The electrical system may compare the error performance of the gas density relay 1 in different periods under different temperatures according to the gas density relay 1. That is, the electrical system compares the error performance of the gas density relay 1 and the performance of the electrical equipment 8 in different periods and within the same temperature range. The performance of the gas density relay 1 and the performance of the electrical equipment 8 are determined and compared in various historical periods and between history and the present.

The electrical equipment may be checked repeatedly for a plurality of times (such as 2-3 times), and an average value of the electrical equipment is calculated according to each check result. If necessary, the online check may be performed to the gas density relay at any time.

The gas density relay 1 includes: a gas density relay with bimetal compensation, a gas density relay with gas compensation, or a gas density relay of a mixed type of the bimetal and the gas compensation; a fully mechanical gas density relay, a digital gas density relay, and a gas density relay with a mixed mechanical and digital type; a density relay with indication (a density relay with a pointer display, a density relay with the digital display, or a density relay with the liquid crystal display), and a density relay without indication (i.e., a density switch); an SF6 gas density relay, an SF6 mixed gas density relay, an N2 gas density relay, other gas density relays, etc.

The type of the pressure sensor 2 includes an absolute pressure sensor, a relative pressure sensor, or the absolute pressure sensor and the relative pressure sensor, and a plurality of the absolute pressure sensors or the relative pressure sensors may be provided. The type of the pressure sensor may be a diffusion silicon pressure sensor, a MEMS pressure sensor, a chip pressure sensor, a coil induction pressure sensor (such as a pressure measuring sensor where a Bourdon tube is attached with an induction coil), a resistance pressure sensor (such as a pressure measuring sensor where the Bourdon tube is attached with slide wire resistance), an analog quantity pressure sensor, and a digital quantity pressure sensor. The pressure is collected via the pressure sensor, the pressure transmitter and various pressure sensing elements, such as the diffusion silicon type, sapphire type, piezoelectric type and strain gauge type (resistance strain gauge type and ceramic strain gauge type).

The temperature sensor 3 may be a thermocouple, a thermistor, a semiconductor type, a contact type and a non-contact type, a thermal resistance and the thermocouple. In short, the temperature transducer, the temperature transmitter and various temperature sensing elements can be used for the temperature collection.

The temperature regulation mechanism 5 is a heating element. Alternatively, the temperature regulating mechanism mainly consists of the heating element, a heat insulation element, a temperature controller, a temperature detector, and a temperature regulating mechanism outer shell. Alternatively, the temperature regulating mechanism mainly consists of the heating element and the temperature controller. Alternatively, the temperature regulating mechanism mainly consists of the heating element, a heating power regulator and the temperature controller. Alternatively, the temperature regulating mechanism mainly consists of the heating element, a refrigeration element, the heating power regulator and the temperature controller. Alternatively, the temperature regulating mechanism mainly consists of the heating element, the heating power regulator and a thermostatic controller. Alternatively, the temperature regulating mechanism mainly consists of the heating element, the temperature controller, and the temperature detector. Alternatively, the temperature regulating mechanism is the heating element which is arranged near a temperature compensation element. Alternatively, the temperature regulating mechanism is a miniature constant temperature box. The heating element includes but is not limited to one of a silicone rubber heater, a resistance wire, an electric heating tape, an electric heating rod, a hot gas fan, an infrared ray heater element, and a semiconductor. The heating element consists of a plurality of heating element groups. The temperature controller includes but is limited to one of a PID controller, a controller with PID combined with fuzzy control, an inverter controller, and a PLC controller.

The online check contact signal sampling unit 6 mainly completes the contact signal sampling of the gas density relay 1. That is, the basic requirements or functions of the online check contact signal sampling unit 6 are as follows: 1) the safe operation of the electrical equipment is not affected during the check. That is, the safe operation of the electrical equipment is not affected when the contact signal of the gas density relay 1 acts during the check; 2) a control loop of the contact signal of the gas density relay 1 does not affect the performance of the gas density relay, especially the performance of the intelligent control unit 7, does not damage the gas density relay or affect test work.

The basic requirements or functions of the intelligent control unit 7 are as follows: the control of a valve as well as the control and signal collection of the temperature regulation mechanism 5 and a pressure regulating mechanism 11 are completed via the intelligent control unit 7.

Implementation: The pressure value and temperature value when the contact signal of the gas density relay 1 acts can be detected and converted into the corresponding pressure value $P_{20}$ (density value) at 20° C., that is, the contact action value $P_{D20}$ of the gas density relay 1 can be detected, and the check of the gas density relay 1 can be performed. Alternatively, when the contact signal of the gas density relay 1 acts, the density value $P_{D20}$ may be detected directly, so as to complete the check of the gas density relay 1.

Of course, the intelligent control unit 7 may further realize the followings: storing test data; and/or exporting the test data; and/or printing the test data; and/or performing data communication with an upper computer; and/or inputting information of an analog quantity and a digital quantity. The intelligent control unit 7 may further include a communication module, through which the remote transmission of the test data and/or the check result and other information may be realized. When a rated pressure value of the gas density relay 1 outputs a signal, the intelligent control unit 7 collects the density value at the that time to complete the check of the rated pressure value of the gas density relay 1.

The electrical equipment includes SF6 gas electrical equipment, SF6 mixed gas electrical equipment, environmental protection gas electrical equipment, or other insulating gas electrical equipment. Specifically, the electrical equipment includes GIS, GIL, PASS, a circuit breaker, a current transformer, a voltage transformer, a transformer, an inflatable cabinet and a ring main unit, etc.

The electrical system has the functions of pressure and temperature measurement and software conversion. On the premise that the safe operation of the electrical equipment 8 is not affected, an action value and/or a return value of the alarm and/or a blocking contact of the gas density relay 1 may be detected online. Of course, the return value of the alarm and/or the blocking contact signal may not also be tested as required.

When completing the check of the gas density relay, the electrical system automatically compares and determines the results with each other. If an error is large, an abnormal prompt is issued: a problem with the gas density relay, the pressure sensor, or the temperature transducer is provided. That is, the electrical system may complete the mutual check function of the gas density relay and the pressure sensor, the temperature transducer, or a density transmitter, and has artificial intelligence check ability. After the check is completed, the electrical system may automatically generate a check report, and automatically issue an alarm if the abnormity is provided, or send the abnormity to the designated receiver, such as the mobile phone. The electrical system displays the gas density value and the check result locally on site, or displays the gas density value and the check result in the background. A specific way thereof may be flexible. The electrical system has the functions of data display, trend analysis, historical data query, real-time alarm and so on of a real-time online gas density value, the pressure value, the temperature value and so on. The electrical system may monitor the gas density value, or the gas density value, the pressure value, and the temperature value online. The electrical system has a self-diagnosis function, may notify timely the abnormality, such as wire disconnection, a short circuit alarm, sensor damage, and may compare the error performance of the electrical system under different temperatures in different periods. That is, the electrical system compares the error performance of the electrical system in different periods and within the same temperature range to determine the performance of the electrical system. Specifically, comparison of various periods and comparison of history and present. The electrical system may determine, analyze and compare normalnesses and abnormities of the gas density value of the electrical equipment 8, the gas density relay 1, the pressure sensor 2, and the temperature transducer 3. The electrical system also contains an analysis system (an expert management analysis system) which may monitor a gas density, detect, analyze and determine the gas density relay and a monitoring element, and know where a problem is. The electrical system may further monitor the state of the contact signal of the gas density relay 1, and remotely transmit the state. It can be known in the background whether the state of the contact signal of the gas density relay 1 is open or closed, so as to add a layer of monitoring and improve reliability. The electrical system may further detect, or detect and determine the temperature compensation performance of the gas density relay 1, detect, or detect and determine the contact resistance of a contact of the gas density relay 1, have the functions of data analysis and data processing, and perform corresponding fault diagnosis and prediction of the electrical equipment 8. The electrical system may monitor online the gas density of the electrical equipment 8.

As long as the test data of the pressure sensor 2, the temperature transducer 3 and the gas density relay 1 are consistent and normal, it means that the electrical system is normal. Therefore, no need is provided to check the gas density relay and other devices. The check can be exempted throughout the life of the devices. Only if the test data of the pressure sensor 2, the temperature transducer 3 and the gas density relay 1 are not consistent or normal, a maintenance man is arranged to deal with the test data. For consistent and normal conditions, no check is required, which greatly improves reliability, improves work efficiency, and reduces costs.

Embodiment II

Figure 3:
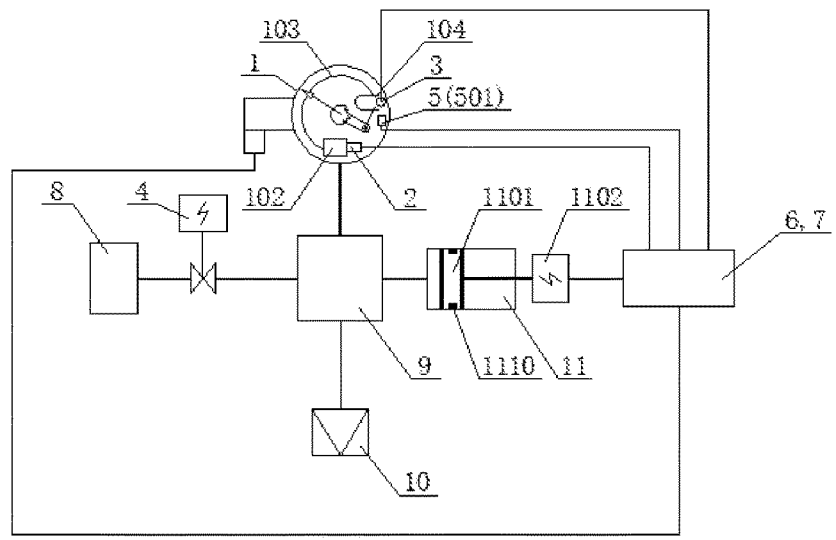
FIG. 3 is structural diagram of electrical system with online sampling check function of embodiment 2.

As shown in FIG. 3, the embodiment II of the present disclosure provides a gas density relay with an online check function. The gas density relay includes a gas density relay 1, a pressure sensor 2, a temperature transducer 3, a valve 4, a temperature regulation mechanism 5, an online check contact signal sampling unit 6, an intelligent control unit 7, a multichannel joint 9, an air admission interface 10 and a pressure regulating mechanism 11. One end of the valve 4 is hermetically connected to the electrical equipment 8, and the other end of the valve 4 is connected to the multichannel joint 9. The gas density relay 1 is mounted on the multichannel joint 9. The pressure sensor 2 and the temperature transducer 3 are arranged on the gas density relay 1. The pressure sensor 2 communicates with the gas density relay 1 on a gas path. The temperature regulation mechanism 5 is arranged on the gas density relay 1, mainly consists of a heating element 501 and is controlled by the intelligent control unit 7. That is, a controller of the heating element 501 and the intelligent control unit 7 are arranged or designed together. The pressure regulating mechanism 11 is mounted on the multichannel joint 9 and communicates with the gas density relay 1. The online check contact signal sampling unit 6 and the intelligent control unit 7 are arranged together. The pressure sensor 6, the temperature transducer 3, the valve 4, the temperature regulation mechanism 5, and the pressure regulating mechanism 11 are connected to the intelligent control unit 7, respectively. The air admission interface 10 communicates with the multichannel joint 9.

Different from the embodiment I, this embodiment further includes the pressure regulating mechanism 11. The pressure regulating mechanism 11 includes a piston 1101, a drive mechanism 1102 and a sealing ring 1110. The piston 1101 is driven to move in the pressure regulating mechanism via the drive mechanism 1102, and then the pressure rising and falling can be completed.

The working principle is as follows: the online check contact signal sampling unit 6 is adjusted to a check state via the intelligent control unit 7. Under the check state, the online check contact signal sampling unit 6 cuts off a control loop of a contact signal of the gas density relay 1, so that the contact of the gas density relay 1 is connected to the intelligent control unit 7. The valve 4 between the gas density relay 1 and electrical equipment 8 is closed by the intelligent control unit 7. The pressure regulating mechanism 11 is driven by the intelligent control unit 7, so that a pressure of the gas density relay 1 falls slowly, and after falling to a target pressure value, this operation may stop. Then, the temperature regulation mechanism 5 is operated or controlled by the intelligent control unit 7, so that a temperature of the gas density relay 1 rises. Then, a temperature of a temperature compensation element of the gas density relay 1 rises, so that a contact action occurs to the gas density relay 1. The contact action is delivered to the intelligent control unit 7 via the online check contact signal sampling unit 6. The intelligent control unit 7 obtains a gas density value according to a pressure value and a temperature value when the contact acts, or obtains the gas density value directly, detects an action value of the contact signal of the gas density relay, and completes the check of the action value of the contact signal of the gas density relay 1. This operation is similar to that of the embodiment I. The intelligent control unit 7 further includes a depth calculation unit.

The depth calculation unit may operate or control the temperature regulation mechanism 5 via the intelligent control unit 7 based on an ambient temperature value, and the gas density value or a pressure value of the electrical equipment, so that the temperature of the gas density relay 1 is reduced. Then, the temperature of the temperature compensation element of the gas density relay 1 is reduced, so that a contact reset occurs to the gas density relay 1. Then, the contact reset is transmitted to the intelligent control unit 7 via the online check contact signal sampling unit 6. The intelligent control unit 7 obtains the gas density value according to a pressure value and a temperature value when the contact resets, or obtains the gas density value directly, detects a return value of the contact signal of the gas density relay 1, and completes the check of the return value of the contact signal of the gas density relay 1.

When the check of all of the contact signals is completed, the heating element of the temperature regulation mechanism 5 is turned off by the intelligent control unit 7. The online check contact signal sampling unit 6 is adjusted to a working state. A control loop of the contact signal of the gas density relay 1 is recovered to a normal working state. In this embodiment, the operation sequence of the temperature regulation mechanism 5 and the pressure regulating mechanism 11 may be flexible. That is, the pressure regulating mechanism 11 may be operated first, and then the temperature regulation mechanism 5 is operated. Alternatively, the temperature regulation mechanism 5 may be operated first, and then the pressure regulating mechanism 11 is operated. Alternatively, the pressure regulating mechanism 11 and the temperature regulation mechanism 5 may be operated at the same time.

The valve 4 may be controlled by various transmission modes, such as manual, electric, hydraulic, pneumatic, turbine, electromagnetic, electromagnetic hydraulic, electro-hydraulic, gas-hydraulic, spur gear, bevel gear drive, etc. Under the action of a pressure, a temperature or other forms of sensing signals, the valve acts according to predetermined requirements, or simply opens or closes without relying on the sensing signals. The valve relies on a drive mechanism or an automatic mechanism to make opening and closing members lift, slide, swing or rotate, thereby changing the size of a flow channel area of the valve to achieve a control function of the valve. The valve 4 may be an automatic valve, a power-driven valve and a manual valve according to a drive mode. The automatic valve may include: an electromagnetic drive valve, an electromagnetic-hydraulic drive valve, an electro-hydraulic drive valve, a turbine drive valve, a spur gear drive valve, a bevel gear drive valve, a pneumatic drive valve, a hydraulic drive valve, a gas-hydraulic drive valve, a valve with an electrically motorized operation, and an electric motor (motor) drive valve. The valve 4 may be automatic, manual or semi-automatic. A check process may be completed automatically or semi-automatically through manual cooperation. The valve 4 is directly or indirectly connected to the electrical equipment 8 via a self-sealing valve, the manual valve, or a non-removable valve, and connected integrally or separately. The valve 4 may be a normally open type or a normally closed type, and may be a one-way type or a two-way type as required. In short, a gas path is opened or closed by an electronically controlled valve. The electronically controlled valve may be a solenoid valve, an electronically controlled ball valve, the valve with the electrically motorized operation, an electronically controlled proportional valve, and so on. The valve 4 may be the solenoid valve, the valve with the electrically motorized operation, a pneumatically operated valve, a ball valve, a needle valve, a control valve, a stop valve, and other elements, which can open and close the gas path, and even control a flow. The semi-automatic valve may also be the manual valve. The pressure regulating mechanism 11 may be an electric regulating piston, an electric regulating cylinder, a booster pump, a gas cylinder pressurization device, the valve, the solenoid valve, a flow controller, and so on. The semi-automatic valve may also be the pressure regulating mechanism that is manually regulated.

The pressure regulating mechanism 5 in this embodiment is a cavity with an opening at one end. The cavity has a piston 1101 therein. The piston 1101 is provided with a sealing ring 1110. One end of the piston 1101 is connected to a regulating rod. The outer end of the regulating rod is connected to a drive part 1102. The other end of the piston 1101 extends into the opening and is in contact with the inner wall of the cavity. The drive part 1102 drives the regulating rod and then drives the piston 1101 to move in the cavity. The drive part 1102 includes but is not limited to, one of a magnetic force, an electric motor (an inverter electric motor or a stepping electric motor), a reciprocating motion mechanism, a Carnot cycle mechanism, and a pneumatic element.

Embodiment III

Figure 4:
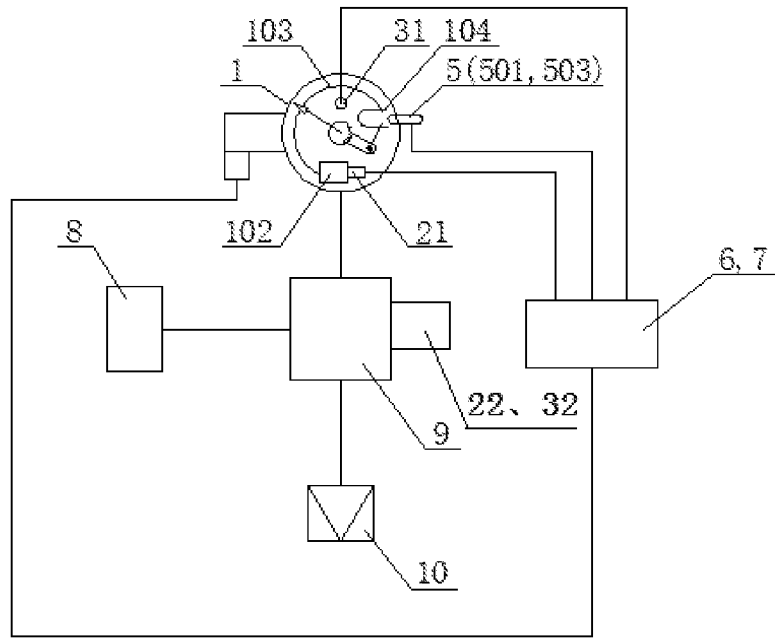
FIG. 4 is structural diagram of electrical system with online sampling check function of embodiment 3.

As shown in FIG. 4, the embodiment III of the present disclosure provides an electric system with an online sampling check function. The electric system includes a gas density relay 1, a first pressure sensor 21, a second pressure sensor 22, a first temperature transducer 31, a second temperature transducer 32, a temperature regulation mechanism 5, an online check contact signal sampling unit 6, an intelligent control unit 7, a multichannel joint 9, an air admission interface 10 and a self-sealing valve 11. One end is the self-sealing valve 11 is sealingly connected to electrical equipment, and the other end of the self-sealing valve 11 is connected to the multichannel joint 9. The gas density relay 1, the second pressure sensor 22, the second temperature transducer 32, the temperature regulation mechanism 5, and the air admission interface 10 are arranged on the multichannel joint 9. The first pressure sensor 21 and the first temperature transducer 31 are arranged on the gas density relay 1. The second pressure sensor 21, the second temperature transducer 22, the first temperature transducer 31 and the second temperature transducer 32 are respectively connected to the intelligent control unit 7. The first pressure sensor 21, the second pressure sensor 22, and the gas density relay main body 1 communicate with each other on the gas path.

Different from the embodiment I, there are two pressure sensors, which are the first pressure sensor 21 and the second pressure sensor 22, and there are two temperature transducers, which are the first temperature transducer 31 and the second temperature transducer 32 This embodiment provides a plurality of pressure sensors and temperature transducers for the following purpose: pressure values obtained by monitoring the first pressure sensor 21 and the second pressure sensor 22 may be compared and mutually checked. Temperature values obtained by monitoring the first temperature transducer 31 and the second temperature transducer 32 may be compared and mutually checked. A density value $P1_{20}$ obtained by monitoring the first pressure sensor 21 and the first temperature transducer 31 and a density value $P2_{20}$ obtained by monitoring the second pressure sensor 22 and the second temperature transducer 32 are compared and checked mutually. Even a density value Pen of a rated value of the gas density relay 1 may be obtained through online check. Mutual comparison and mutual check are performed.

Embodiment IV

Figure 5:
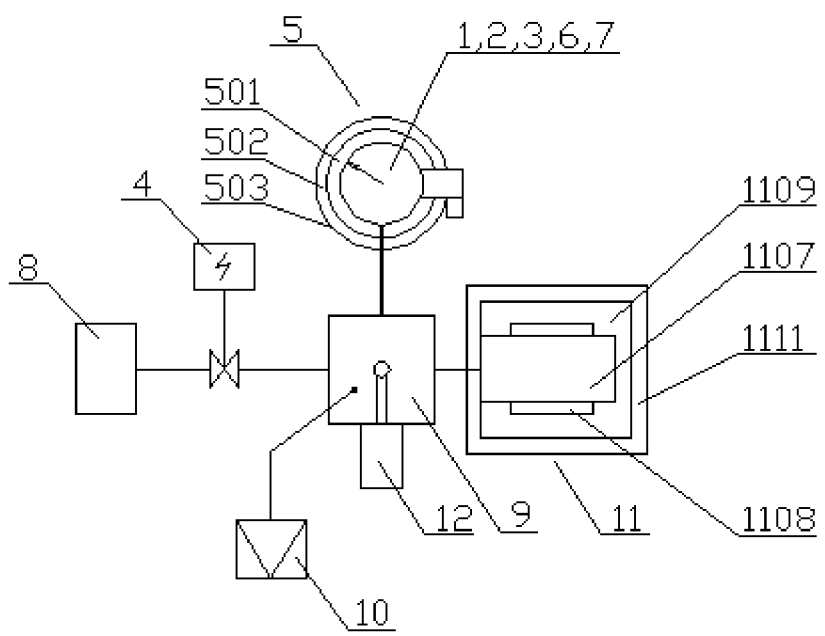
FIG. 5 is structural diagram of electrical system with online sampling check function of embodiment 4.

As shown in FIG. 5, the embodiment IV of the present disclosure provides an electric system with an online sampling check function. The electric system includes a gas density relay 1, a pressure sensor 2, a temperature transducer 3, a valve 4, a temperature regulation mechanism 5 (which mainly consists of a heating element 501, a heat insulation element 502, and a temperature regulation mechanism outer shell 503), an online check contact signal sampling unit 6, an intelligent control unit 7, electric equipment 8, a multichannel joint 9, an air admission interface 10, a pressure regulating mechanism 11, and a miniature sensor 12. One end of the valve 4 is sealingly connected to the electrical equipment 8, and the other end of the self-sealing valve 4 communicates with the multichannel joint 9. An air outlet of the valve 4 communicates with the gas density relay 1, the pressure sensor 2, the pressure regulating mechanism 11, and the air admission interface 10 on a gas path via the multichannel joint 9. The pressure sensor 2 and the temperature transducer 3 are arranged together to form a gas density transmitter, which directly obtains a gas density value, a pressure value, and a temperature value. The pressure regulating mechanism 11 communicates with the gas density relay 1 via the multichannel joint 9. The online check contact signal sampling unit 6 and the intelligent control unit 7 are arranged together. The pressure sensor 2 and the temperature transducer 3 are directly or indirectly connected to the intelligent control unit 7. The valve 4 is connected to the intelligent control unit 7. The temperature regulation mechanism 5, and the pressure regulating mechanism 11 are connected to the intelligent control unit 7.

The difference from embodiment I is as follows:

1) The pressure regulating mechanism 11 of this embodiment mainly consists of an air chamber 1107, a heater 1108, a heat insulation element 1109, and an outer shell 1111. According to the control of the intelligent control unit 7, the pressure regulating mechanism 11 changes a temperature of the air chamber 1107 and a pressure of a sealed cavity, thereby completing the rise and fall of the pressure.

2) The pressure sensor 2 and the temperature transducer 3 are arranged together to form a gas density transmitter, which can directly obtain the gas density value, the pressure value, and the temperature value. The temperature regulation mechanism 5 regulates the temperature, and the pressure regulating mechanism 11 regulates the pressure, so that a contact action occurs to the gas density relay 1. The contact action is transmitted to the intelligent control unit 7 via the online check contact signal sampling unit 6. According to the density value, even the pressure value and the temperature value when a contact of the gas density relay 1 acts, the intelligent control unit 7 detects an alarm and/or a blocking contact action value and/or a return value of the gas density relay 1, and completes the check of the gas density relay 1. Alternatively, the intelligent control unit 7 only detects the alarm and/or the blocking contact action value of the gas density relay 1 so as to complete the check of the gas density relay 1.

Embodiment V

Figure 6:
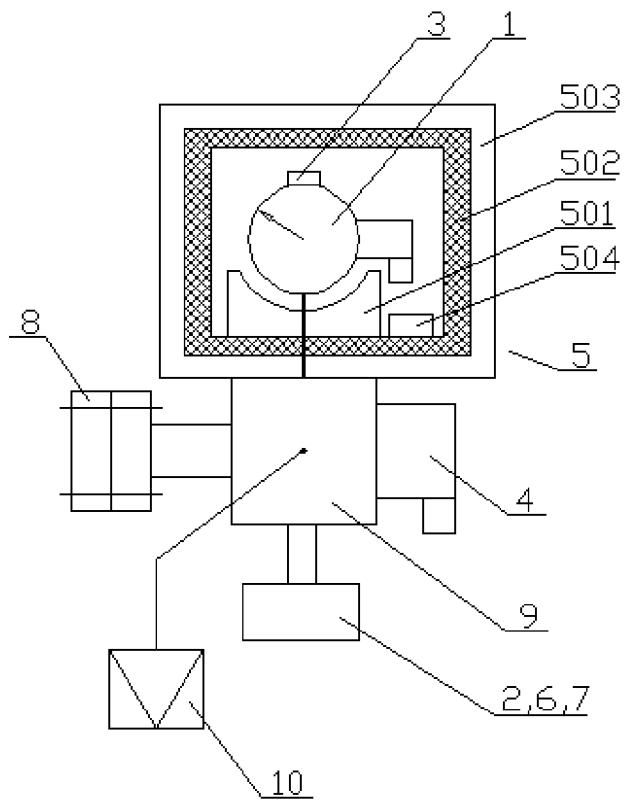
FIG. 6 is structural diagram of electrical system with online sampling check function of embodiment 5.

As shown in FIG. 6, the embodiment V of the present disclosure provides an electric system with an online sampling check function. The electric system includes a gas density relay 1, a pressure sensor 2, a temperature transducer 3, a valve 4, a temperature regulation mechanism 5, an online check contact signal sampling unit 6, an intelligent control unit 7, electric equipment 8, a multichannel joint 9, and an air admission interface 10.

In a normal working state, the gas density relay monitors the gas density value in the electrical equipment, and at the same time, the gas density relay monitors the gas density value in the electrical equipment online via a gas density detection sensor and the intelligent control unit. According to set check time and/or check instructions as well as the gas density value and/or the temperature value, under the condition of allowing and/or checking the gas density relay, the intelligent control unit or the gas density relay regulates the online check contact signal sampling unit 6 to a check state. Under the check state, the online check contact signal sampling unit 6 cuts off a control loop of a contact signal of the gas density relay 1, so that a contact of the gas density relay 1 is connected to the intelligent control unit 7. The temperature regulation mechanism 5 is controlled by the intelligent control unit 7, so that a gas temperature of the gas density relay rises. After the gas temperature rises to a setting value, the valve 4 is closed by the intelligent control unit 7. After the gas temperature or a gas pressure of the gas density relay falls to a suitable value, the temperature regulation mechanism 5 is controlled by the intelligent control unit 7 again, so that the temperature of the gas density relay rises. Then, a temperature of a temperature compensation element of the gas density relay 1 rises, so that a contact action occurs to the gas density relay. The contact action is delivered to the intelligent control unit 7 via the online check contact signal sampling unit 6. The intelligent control unit 7 obtains the gas density value according to the pressure value and the temperature value when the contact acts, or directly obtains the gas density value, detects an action value of the contact signal of the gas density relay 1, and completes the check of the action value of the contact signal of the gas density relay. When the check of all of the contact signals is completed, the intelligent control unit 7 opens the valve 4 and turns off the temperature regulation mechanism 5.

Embodiment VI

Figure 7:
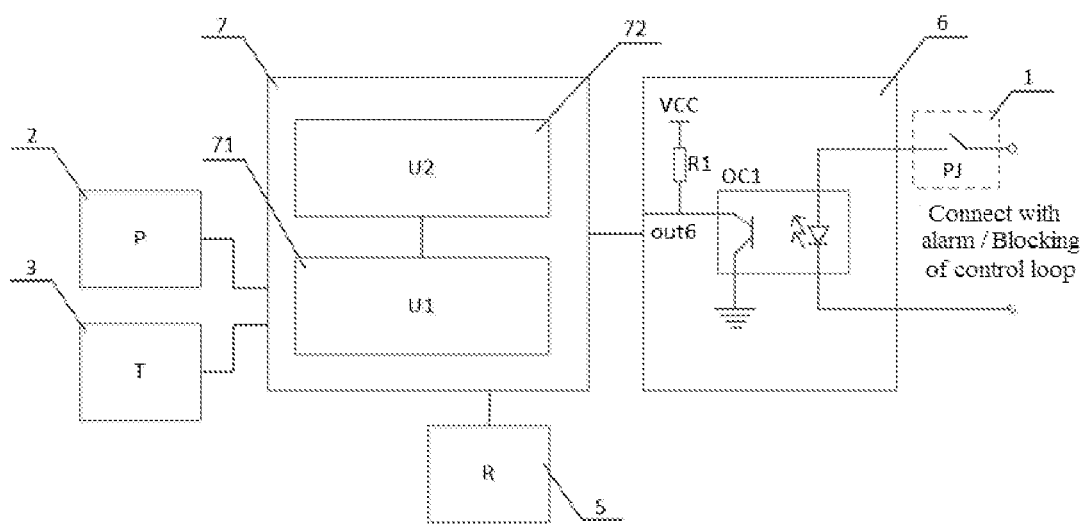
FIG. 7 is control circuit diagram of electrical system of embodiment 6.

As shown in FIG. 7, an online check contact signal sampling unit is provided with a contact sampling circuit. In this embodiment, the contact sampling circuit includes a photocoupler OC1 and a resistor R1. The photocoupler includes a light-emitting diode and a phototriode. A positive electrode of the light-emitting diode is connected in series with a contact of a gas density relay to form a closed loop. An emitter of the phototriode is grounded. A collector of the phototriode is connected to an intelligent control unit as an output terminal out6 of the online check contact signal sampling unit 6. The collector of the phototriode is also connected to a power supply via the resistor.

With the above contact sampling circuit, it may be easily known whether the state of the contact $P_J$ of the gas density relay 1 is open or closed. Specifically, when the contact $P_J$ is closed, the closed loop is powered on, and the light-emitting diode emits light. The phototriode is turned on by the light. The collector of the phototriode outputs a lower level. When the contact $P_J$ is open, the closed loop is powered off, and the light-emitting diode does not emit light. The phototriode is turned off. The collector of the phototriode outputs a high level. The output terminal out6 of the online check contact signal sampling unit 6 outputs a height level and a lower level.

In this embodiment, the intelligent control unit 7 is isolated from the control loop of the contact signal via a method of photoelectric isolation. The contact PJ is closed during a check process, or the contact $P_J$ also is closed in the case of air leakage. At this time, the lower level output by the collector of the phototransistor is detected in both cases. The time of closing the contact $P_J$ during the check process is controlled to a preset period, so that the duration of the contact PJ in a closed state during the check process is determined in the case of non-air leakage. By monitoring the duration of the received low level, it may be determined whether the contact $P_J$ is closed during the check process. Therefore, it may be determined by recording the time during the check that the alarm signal issued by the gas density relay 1 is an alarm signal during the check, but not an alarm signal during gas leakage.

In this embodiment, the intelligent control unit 7 mainly consists of a processor 71(U1), and a power supply 72 (U2).

Embodiment VII

Figure 8:
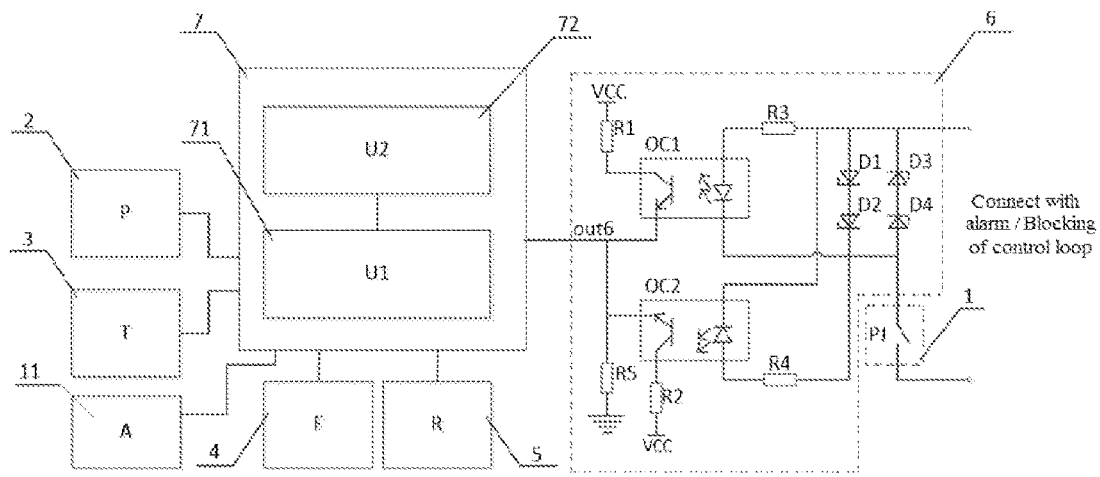
FIG. 8 is control circuit diagram of electrical system of embodiment 7.

As shown in FIG. 8, an online check contact signal sampling unit is provided with a contact sampling circuit. In this embodiment, the contact sampling circuit includes a first photocoupler OC1, and a second photocoupler OC2.

A light-emitting diode of the first photocoupler OC1 and a light-emitting diode of the second photocoupler are connected in parallel via a current limiting resistor, and then are connected in series with a contact of a gas density relay to form a closed loop. The light-emitting diodes of the first photocoupler OC1 and the second photocoupler OC2 are connected in opposite directions. A collector of a phototriode of the first photocoupler OC1 and a collector of a phototriode of the second photocoupler OC2 are both connected to a power supply via a voltage dividing resistor. An emitter of the phototriode of the first photocoupler OC1 is connected to an emitter of the phototriode of the second optocoupler OC2 to form an output terminal out6. The output terminal out6 is connected to an intelligent control unit 7 and is grounded by a resistor R5.

With the above contact sampling circuit, it may be easily known whether the state of the contact $P_J$ of the gas density relay 1 is open or closed. Specifically, when a contact $P_J$ is closed, the closed loop is powered on. The first photocoupler OC1 is turned on. The second photocoupler OC2 is turned off. The emitter (i.e., the output terminal out6) of the phototriode of the first photocoupler outputs a high level. Alternatively, the first photocoupler is turned off. The second photocoupler is turned on. The emitter of the phototriode of the second photocoupler outputs a high level. When the contact $P_J$ is open, the closed loop is powered off. Both the first photocoupler and the second photocoupler are turned off. The emitters of the phototriodes of the first photocoupler and the second photocoupler output a low level.

In a preferable embodiment, a contact sampling circuit further includes a first Zener diode group, and a second Zener diode group. The first Zener diode group and the second Zener diode group are connected in parallel on a control loop of a contact signal. The first Zener diode group and the second Zener diode group are connected in opposite directions. The first Zener diode group and the second Zener diode group each consist of one, two or more Zener diodes connected in series.

In this embodiment, the first Zener diode group includes a first Zener diode D1 and a second Zener diode D2 connected in series. A negative electrode of the first Zener diode is connected to a positive electrode of the second Zener diode. The second Zener diode group includes a third Zener diode and a fourth Zener diode connected in series. A positive electrode of the third Zener diode is connected to a negative electrode of the fourth Zener diode.

The contact sampling circuit may easily monitor a state of the contact PJ of the gas density relay 1. Combined with the intelligent control unit 7, an open state or a closed state of the contact $P_J$ is correspondingly processed and remotely transmitted. The state of the contact signal is known from a background, greatly improving the reliability of a power grid.

In this embodiment, the intelligent control unit 7 mainly consists of a processor 71(U1), and a power supply 72 (U2).

Embodiment VIII

Figure 9:
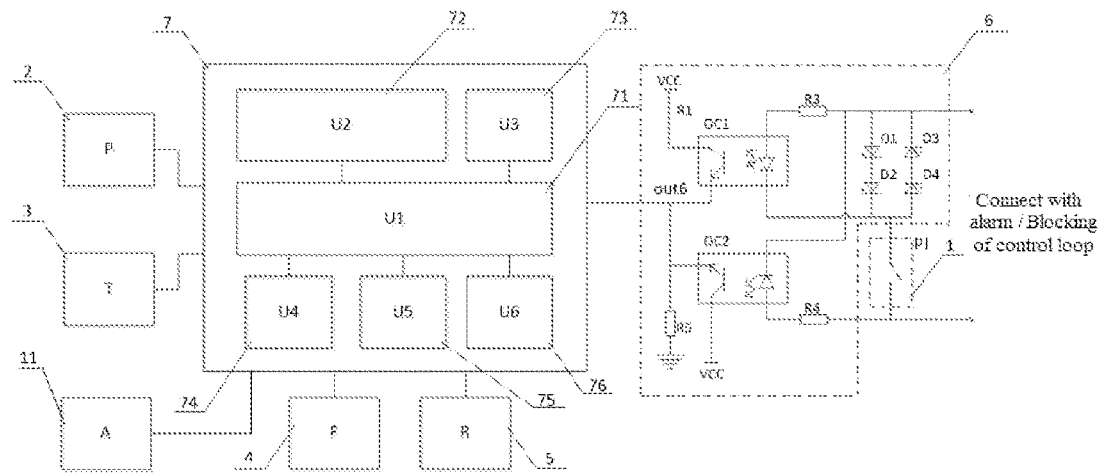
FIG. 9 is control circuit diagram of electrical system of embodiment 8.

As shown in FIG. 9, the difference between this embodiment and the embodiment VIII is as follows: the intelligent control unit 7 mainly consists of a processor 71 (U1), a power supply 72 (U2), a communication module 73 (U3), an intelligent control unit protection circuit 74 (U4), a display and output device 75 (U5), and a data storage 76 (U6) device.

The communication way of the communication module may be wire, such as RS232, RS485, CAN-BUS and other industrial buses, an optical fiber ethernet, 4-20 mA, Hart, IIC, SPI, Wire, a coaxial cable, an PLC power line carrier, etc. The communication way of the communication module may be wireless, such as 2G/3G/4G/5G, WIFI, Bluetooth, Lora, Lorawan, Zigbee, infrared, ultrasonic, acoustic, satellite, light wave, quantum communication, sonar, etc. The intelligent control unit protection circuit 74 (U4) can be an anti-static interference circuit (such as ESD, EMI), an anti-surge circuit, an electrical fast protection circuit, an anti-radio frequency field interference circuit, an anti-burst interference circuit, a power supply short-circuit protection circuit, a power supply reverse-connection protection circuit, an electrical contact misconnection protection circuit, a charging protection circuit, etc. One or a plurality of these intelligent control unit protection circuits may be combined flexibly. The display and output device 75 (U5) may be a digital tube, LED, LCD, HMI, a display, a matrix screen, a printer, a fax, a projector, a mobile phone, etc., one or a plurality of which may be combined flexibly. One or a plurality of flash memory cards such as FLASH, RAM, ROM, a hard disk, SD, etc., a magnetic tape, a punched paper tape, an optical disc, a U disc, a disc, a film roll, etc. may be combined to form the data storage device 76 (U6).

Embodiment IX

Figure 10:
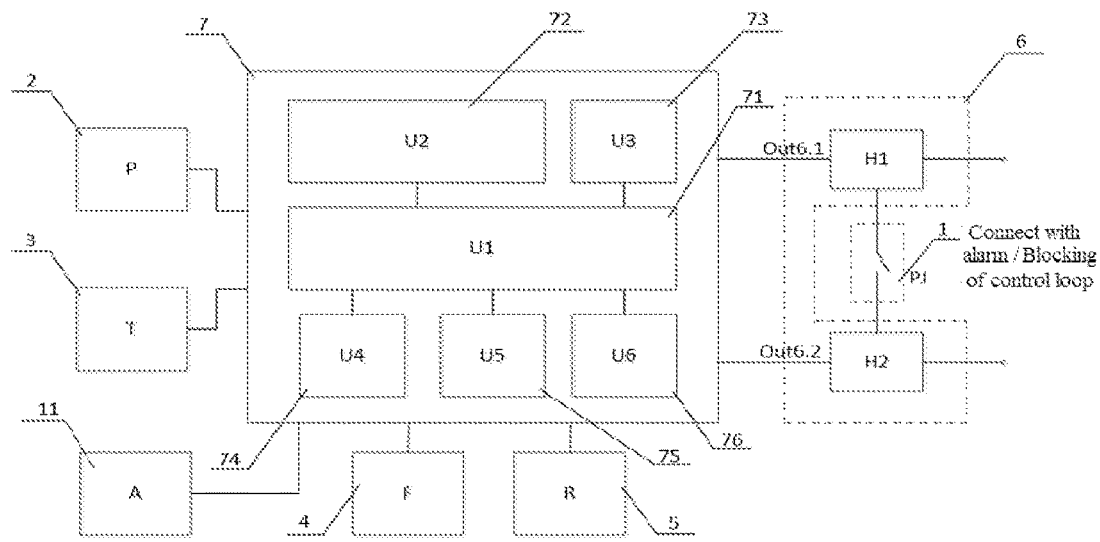
FIG. 10 is control circuit diagram of electrical system of embodiment 9.

As shown in FIG. 10, an online check contact signal sampling unit 6 is provided with a contact sampling circuit. In this embodiment, the contact sampling circuit includes a first Hall current sensor H1, and a second Hall current sensor H2. The first Hall current sensor H1, the second Hall current sensor H2, and a contact $P_J$ of a gas density relay are connected in series to form a closed loop. The contact $P_J$ of the gas density relay is connected between the first Hall current sensor H1 and the second Hall current sensor H2. An output terminal of the first Hall current sensor and an output terminal of the second Hall current sensor are both connected to an intelligent control unit.

With the above contact sampling circuit, it may be easily known whether the state of the contact $P_J$ of the gas density relay 1 is open or closed. Specifically, when the contact $P_J$ is closed, the closed loop is powered on, and current flows between the first Hall current sensor H1 and the second Hall current sensor H2 to generate induced electromotive force. When the contact $P_J$ is open, the closed loop is powered off, and no current flows between the first Hall current sensor H1 and the second Hall current sensor H2 to generate zero induced electromotive force.

In this embodiment, the intelligent control unit 7 mainly consists of a processor 71 (U1), a power supply 72 (U2), a communication module 73 (U3), an intelligent control unit protection circuit 74 (U4), a display and output device 75 (U5), and a data storage 76 (U6) device.

Embodiment X

Figure 11:
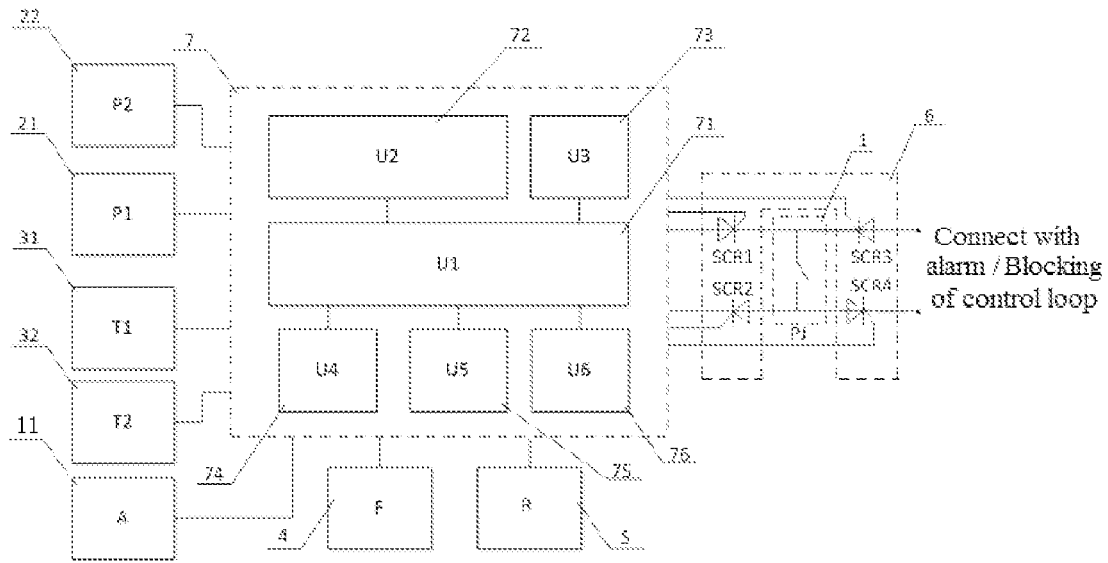
FIG. 11 is control circuit diagram of electrical system of embodiment 10.

As shown in FIG. 11, an online check contact signal sampling unit is provided with a contact sampling circuit. In this embodiment, the contact sampling circuit includes a first silicon controlled rectifier SCR1, a second silicon controlled rectifier SCR2, a third silicon controlled rectifier SCR3, and a fourth silicon controlled rectifier SCR4.

The first silicon controlled rectifier SCR1 and the third silicon controlled rectifier SCR3 are connected in series. The second silicon controlled rectifier SCR2 and the fourth silicon controlled rectifier SCR4 are connected in series and then form a series-parallel closed loop together with a series circuit formed by the first silicon controlled rectifier SCR1 and the third silicon controlled rectifier SCR3. One end of a contact $P_J$ of a gas density relay is electrically connected to a circuit between the first silicon controlled rectifier SCR1 and the third silicon controlled rectifier SCR3 via a wire, and the other end thereof is connected with a circuit between the second silicon controlled rectifier SCR2 and the fourth silicon controlled rectifier SCR4 via the wire. As shown in FIG. 6, a series-parallel connected circuit described here is a circuit in which the above elements and components are connected in parallel and in series.

Specifically, a positive electrode of the first silicon controlled rectifier SCR1 is connected to a negative electrode of the second silicon controlled rectifier SCR2, so that an output terminal of the online check contact signal sampling unit 6 is connected to the intelligent control unit. A negative electrode of the first silicon controlled rectifier SCR1 is connected to a negative electrode of the third silicon controlled rectifier SCR3. Positive electrodes of the second silicon controlled rectifier SCR2 and the fourth silicon controlled rectifier SCR4 are connected with each other. A positive electrode of the third silicon controlled rectifier SCR3 and a negative electrode of the fourth silicon controlled rectifier SCR4 are connected to an input terminal of the online check contact signal sampling unit 6. Control electrodes of the first silicon controlled rectifier SCR1, the second silicon controlled rectifier SCR2, the third silicon controlled rectifier SCR3, and the fourth silicon controlled rectifier SCR4 are all connected to the intelligent control unit 7. The intelligent control unit 7 may control the turn-on or turn-off of the silicon controlled rectifier.

The working process of this embodiment is as follows:

When check is not performed and operation is normal, a contact $P_J$ is cut off. The contact sampling circuit triggers the third silicon controlled rectifier SCR3 and the fourth silicon controlled rectifier SCR4. The third silicon controlled rectifier SCR3 and the fourth silicon controlled rectifier SCR4 are in a conductive state. A control loop of the a contact signal is in a working state. At this time, the contact sampling circuit does not trigger the first silicon controlled rectifier SCR13 and the second silicon controlled rectifier SCR2, and the negative electrodes of the first silicon controlled rectifier SCR1 and the second silicon controlled rectifier SCR2 have no voltage output and are in a non-conductive state.

During the check, the contact sampling circuit does not trigger the first silicon controlled rectifier SCR3 and the fourth silicon controlled rectifier SCR4, but triggers the first silicon controlled rectifier SCR1 and the second silicon controlled rectifier SCR2. At this time, the third silicon controlled rectifier SCR3 and the fourth silicon controlled rectifier SCR4 are in a non-conductive state. The contact $P_J$ is isolated from the contact signal control loop. The first silicon controlled rectifier SCR1 and the second silicon controlled rectifier SCR2 are in a conductive state. The contact $P_J$ communicates with the online check contact signal sampling unit 6 and is connected to the intelligent control unit 7.

The online check contact signal sampling unit 6 may also mixedly and flexibly consist of a solid state relay or an electromagnetic relay and the silicon controlled rectifier.

In this embodiment, the intelligent control unit 7 mainly consists of a processor 71 (U1), a power supply 72 (U2), a communication module 73 (U3), an intelligent control unit protection circuit 74 (U4), a display and output device 75 (U5), and a data storage 76 (U6) device.

Embodiment XI

Figure 12:
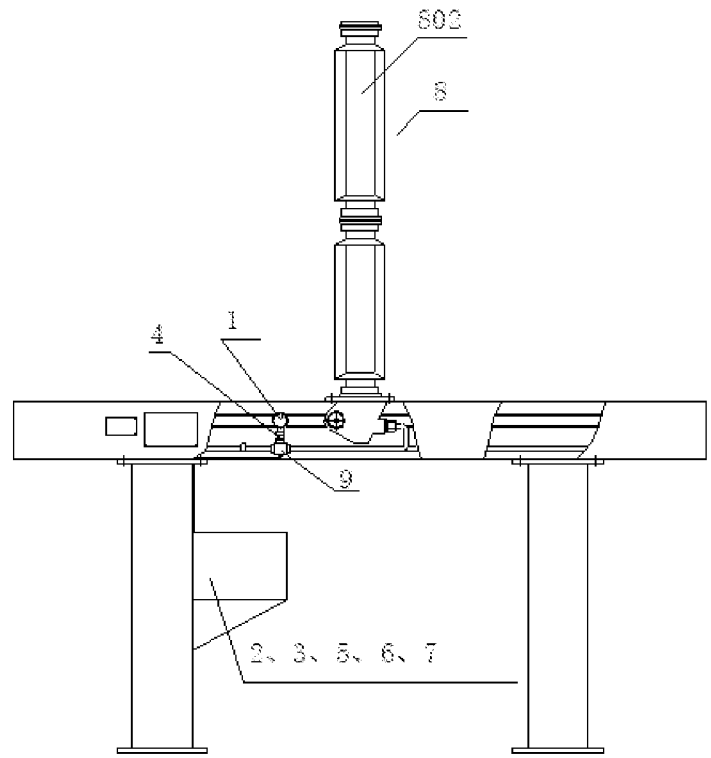
FIG. 12 is structural diagram of gas path of electrical system of embodiment 11.

FIG. 12 is a structural diagram of a gas path of an electrical system of an preferable embodiment of the present disclosure. As shown in FIG. 12, electric equipment 8 is a sulfur hexafluoride high-voltage circuit breaker, and includes an air chamber 802 arranged in the electric equipment 8. The gas density relay 1 is mounted in an inner receiving space of a horizontal frame. One end of a connecting tube is connected to an air inlet of a valve 4, and the other end of the connecting tube extends to a lower side of the air chamber 802 along the horizontal frame, and communicates with the air chamber 802 from below. The air inlet of the valve 4 is sealingly connected to the air chamber the electrical equipment 8 via the connecting tube. An air outlet of the valve 4 communicates with a gas path of a gas density relay 1. A probe of a pressure sensor 2 is arranged on the gas path of the gas density relay 1. A temperature regulation mechanism 5 is arranged outside the gas density relay 1. An online check contact signal sampling unit 6 is connected to the gas density relay 1 and the intelligent control unit 7, respectively. The pressure sensor 2, a temperature transducer 3, a valve 4, and the temperature regulation mechanism 5 are also connected to the intelligent control unit 7, respectively. The portion outside the probe of the pressure sensor 1, the portion outside a probe of the temperature transducer 3, the temperature regulation mechanism 5, the online check contact signal sampling unit 6, and the intelligent control unit 7 are fixed on a mounting board of a vertical frame.

When the contacts of the density relay are checked at high temperatures, low temperatures, normal temperatures, and 20° C. ambient temperature, the electrical system with online sampling and check function has different error judgment requirements for the contacts; the specific requirements can be implemented according to the relevant standards as per the temperature; the system can compare the error performance of the gas density relay under different temperatures and different time periods, that is, the comparison in different periods but the same temperature range, so as to judge the performance of the density relay. Specifically, comparison of various periods and comparison of history and present. The system can also perform a physical examination of the density relay. If necessary, the contact signal of gas density relay can be checked at any time; with a gas density relay, the contact signal of gas density relay is judged as per whether the density value of the monitored electrical equipment is normal. That is, the system can judge, analyze and compare the normal and abnormal density value, gas density relay, pressure sensor and temperature transducer of electrical equipment, so as to judge, compare and analyze the gas density monitoring, density relay and other states of electrical equipment; the system can also monitor the contact signal state of gas density relay and transmit its state remotely. The open or closed contact signal state of gas density relay can be known in the background, so as to have more monitoring and improve reliability; the system can also detect and determine the temperature compensation performance of the gas density relay; the contact resistance of the gas density relay; and the insulation performance of the gas density relay. In addition, as far as SF6 gas, the special conversion method for the pressure-temperature characteristic of the SF6 gas may be calculated according to the Beattie-Bridgeman equation. As far as SF6 mixed gas, the special conversion method for the pressure-temperature characteristic of the SF6 mixed gas may be calculated according to the Dalton's Law of Partial Pressure, the Beattie-Bridgeman equation and the ideal gas state equation. The temperature regulation mechanism is installed inside, outside or on the housing of the gas density relay. The signal generator comprises, but is not limited to, a microswitch, a magnetically assisted electric contact, a reed switch and a switchette, and the gas density relay outputs a contact signal through the signal generator; the pressure detector comprises, but is not limited to, a Bourdon tube, a bellows, a bellows+spring and a pressure sensor; the temperature compensation element comprises, but is not limited to, a temperature compensation strip, gas enclosed in the housing, and a temperature compensation strip+gas enclosed in the housing.

To sum up, the invention provides an electrical system with online sampling and check function and its check method. Composed of a gas path (through pipeline) connection part, a pressure regulation part, a signal measurement control part, etc., the system mainly carries out online check and measurement of the contact value (pressure value during alarm/blocking action) of the gas density relay under the ambient temperature and automatically converts the value into the corresponding pressure value at 20° C. to detect the performance of the contact (alarm and blocking) value of the gas density relay online. The installation positions of gas density relay, pressure sensor, temperature transducer, pressure regulating mechanism, valve, online check contact signal sampling unit and intelligent control unit can be flexibly combined. For example, gas density relay, pressure sensor, temperature transducer, online check contact signal sampling unit and intelligent control unit can be combined for integrated design or split design; they can also be installed on the housing, or on the multichannel joint or connected together by connecting pipes. The valve may be directly connected to the electrical equipment, or connected to the electrical equipment through the self-sealing valve or the air pipe. The pressure sensor, the temperature transducer, the online check contact signal sampling unit and the intelligent control unit can be combined together or integrally designed; the pressure sensor and the temperature transducer can be combined together or integrally designed; and the online check contact signal sampling unit and the intelligent control unit can be combined together or integrally designed. In short, the structure is not limited to one type.

The gas density relay in the electrical system with online sampling and check function and its check method described in the present invention, also called as gas density monitoring device in general, can refer to a gas density relay whose constituent elements are designed into an integrated structure, or a gas density relay whose constituent elements are designed into an integral structure.

This application has compact and reasonable structure arrangement, and various components have better anti-rust and anti-vibration abilities, are firmly installed and reliably used. The connection, disassembly and assembly of various pipelines of the electrical system are easy to operate, and the equipment and components are convenient for maintenance. With this application, the check of the gas density relay can be completed without maintenance personnel on site, which greatly improves the reliability of power grid, improves work efficiency and reduces the operation and maintenance cost.

The specific embodiments of the present disclosure are described in details above, and used as examples only. The present disclosure is not limited to the specific embodiments described above. For the personnel skilled in the art, any equal modification and replacement to the present disclosure shall be in the scope of the present disclosure. Therefore, the equal change and modification made without deviating from the spirit and scope of the present disclosure shall be covered within the scope of the present disclosure.

The invention claimed is:

1. An electrical system with online sampling and check function, characterized in that it comprises:
   an electric equipment, in which an air chamber is arranged, and the air chamber is filled with insulating gas;
   a gas density relay, which is mounted outside the air chamber of the electrical equipment, or mounted outside the air chamber of the electrical equipment via a valve;
   a temperature regulating mechanism, which is a regulating mechanism capable of regulating temperature and configured to regulate temperature rise and fall of a temperature compensation element of the gas density relay, so that the gas density relay takes contact signal action;
   a gas density detection sensor, which is communicated with the gas density relay;
   an online check contact signal sampling unit, which is connected with the gas density relay and configured to sample contact signals generated when contacts of the gas density relay body take action;
   an intelligent control unit, which is respectively connected with the gas density detection sensor, the temperature regulation mechanism and the online check contact signal sampling unit, and is configured to control at least one of: the temperature regulation mechanism, pressure value acquisition, temperature value acquisition, gas density value acquisition, detect the contact signal operating value and contact signal return value of the gas density relay;
   the contact signals include at least one of alarm signals and blocking signals.

2. The electrical system with online sampling and check function according to claim 1, characterized in that the electrical system further comprises at least one of a pressure regulating mechanism, and a gas path of the pressure regulating mechanism is connected with the gas density relay; the pressure regulating mechanism is also connected with the intelligent control unit to adjust a pressure rise and fall of the gas density relay under the control of the intelligent control unit, and then cooperate with and combine with the temperature regulation mechanism to make the contact action of the gas density relay;
   it also comprises a heating member connected with the intelligent control unit;
   it also comprises an air chamber and a heating member, where the air chamber is connected with the gas density relay, the heating member is installed outside or inside the air chamber, and the intelligent control unit is connected with the heating member.

3. The electrical system with online sampling and check function according to claim 2, characterized in that, during check, at least one of the pressure regulating mechanism is the sealed air chamber, and the heating element, refrigeration element are provided inside or outside the sealed air chamber; it is heated through the heating element, refrigerated through the refrigeration element, which causes the gas temperature change in the sealed air chamber, and further completes the pressure rise and fall of gas density relay;
   the pressure regulating mechanism is a cavity with an opening at one end, and the other end of the cavity is connected with the gas path of the gas density relay; a piston is set in the cavity; one end of the piston is connected with a regulating rod; the outer end of the regulating rod is connected with a drive part; the other end of the piston stretches into the opening and contacts with the inner wall of the cavity in a sealed manner; a drive part drives the regulating rod and further drives a piston moves in the cavity;
   the pressure regulating mechanism is a closed air chamber, the piston is arranged in the closed air chamber, the piston hermetically contacts with the inner wall of the closed air chamber, and the drive part is arranged outside the closed air chamber and pushes the piston to move in the cavity through electromagnetic force;
   the pressure regulating mechanism is an airbag with one end connected to the drive part, the airbag changes in volume under the drive of the drive part, and the airbag is connected with the gas density relay;
   the pressure regulating mechanism is a bellows, one end of the bellows is connected with the gas density relay, and the other end of the bellows is retractable under the drive of the drive part;
   the pressure regulating mechanism is a deflation valve, which is a solenoid valve or a valve with electrically motorized operation;
   the pressure regulating mechanism is a compressor; the pressure regulating mechanism is a pump, and the pump comprises but is not limited to one of a pressure pump, a booster pump, an electrical gas pump and an electromagnetic gas pump; wherein the drive part comprises one of a magnetic force, an electric motor, a reciprocating motion mechanism, a Carnot cycle mechanism, and a pneumatic element.

4. The electrical system with online sampling and check function according to claim 2, characterized in that the gas path of the pressure regulating mechanism is connected with the gas path of the gas density relay through a first connecting pipe; a gas outlet of the valve is directly connected with the gas path of the gas density relay through a second connecting pipe, or the gas outlet of the valve is connected with the gas path of the pressure regulating mechanism through the second connecting pipe, so as to connect the gas outlet of the valve with the gas path of the gas density relay.

5. The electrical system with online sampling and check function according to claim 1, characterized in that at least one of the contact of the gas density relay is a density relay normally open and the online check contact signal sampling unit comprises a first connecting circuit and a second connecting circuit, where the first connecting circuit is connected with the contact of the gas density relay and a contact signal control loop and the second connecting circuit connects the contact of the gas density relay with the intelligent control unit; in a non-check state, the second connecting circuit is disconnected or isolated, and the first connecting circuit is closed; in a check state, the online check contact signal sampling unit cuts off the first connecting circuit, connects the second connecting circuit, and connects the contact of the gas density relay with the intelligent control unit;
   the contact of the gas density relay is a normally-closed density relay, the online check contact signal sampling unit includes the first connecting circuit and the second connecting circuit, the first connecting circuit is connected with the contact of the gas density relay and the contact signal control loop, and the second connecting circuit is connected with the contact of the gas density relay and the intelligent control unit; under the non-check state, the second connecting circuit is open or isolated, and the first connecting circuit is closed; under the check state, the online check contact signal sampling unit closes the contact signal control loop, cuts off the connection between the contact of the gas density relay and the contact signal control loop, connects the second connecting circuit, and connects the contact of the gas density relay with the intelligent control unit.

6. The electrical system with online sampling and check function according to claim 5, characterized in that the first connecting circuit comprises a first relay, the second connecting circuit comprises a second relay, and the first relay and the second relay are two independent relays or same relays; the first relay is provided with at least one normally closed contact, the second relay is provided with at least one normally open contact, and the normally closed contact and the normally open contact maintain the opposite open/close state; the normally closed contact is connected in series in the contact signal control loop, and the normally open contact is connected to the contact of the gas density relay;
under the non-check state, the normally-closed contact is closed, the normally-open contact is open, and the gas density relay monitors output statuses of contacts in real time; under the check state, the normally-closed contact is open, the normally-open contact is closed, and the contact of the gas density relay is connected with the intelligent control unit by means of the normally-open contact.

7. The electrical system with online sampling and check function according to claim 5, characterized in that at least one of the online check contact signal sampling unit is provided with a contact sampling circuit, which comprises a photocoupler and a resistance; the photocoupler comprises a LED and a phototransistor; the LED and the contact of the gas density relay are connected in series to form a closed circuit; the emitter of the phototransistor is grounded; the collector of the phototransistor is connected with the intelligent control unit, and the collector of the phototransistor is also connected to a power supply through the resistor; when the contact is closed, the closed circuit is energized, the LED emits light, the light turns on the phototransistor, and the collector of the phototransistor outputs a low level; when the contact is disconnected, the closed circuit is disconnected, the LED does not emit light, the phototransistor is cut off, and the collector of the phototransistor outputs a high level;
the contact sampling circuit comprises a first photocoupler and a second photocoupler; the LED of the first photocoupler and the LED of the second photocoupler are connected in parallel or directly in parallel through the current limiting resistor respectively, and then connected in series with the contact of the gas density relay to form a closed circuit, and the LED of the first photocoupler and the second photocoupler is connected oppositely; the collector of the phototransistor of the first photocoupler and that of the second photocoupler are connected with the power supply through a resistive divider, the emitter of the phototransistor of the first photocoupler is connected with that of the second photocoupler to form an output end which is connected with the intelligent control unit, and grounded through a resistor; when the contact is closed, the closed circuit is energized, the first photocoupler is on, the second photocoupler is off, and the emitter of the phototransistor of the first photocoupler outputs a high level;
the first photocoupler is cut off, the second photocoupler is turned on, and the emitter of the phototransistor of the second photocoupler outputs a high level; when the contact is disconnected, the closed circuit is powered off, the first photocoupler and the second photocoupler are cut off, and the emitter of the phototransistor of the first photocoupler and the second photocoupler outputs a low level; alternatively, the contact sampling circuit comprises a first Hall current sensor and a second Hall current sensor, where the contacts of the first Hall current sensor, the second Hall current sensor and the gas density relay are connected in series to form the closed circuit, and the contact of the gas density relay is connected between the first Hall current sensor and the second Hall current sensor; the output end of the first Hall current sensor and that of the second Hall current sensor are connected with the intelligent control unit; when the contact is closed, the closed circuit is energized, and current flows between the first Hall current sensor and the second Hall current sensor to generate an induced potential; when the contact is disconnected, the closed circuit is powered off, making no current flow between the first Hall current sensor and the second Hall current sensor, and the induced potential zero;
the contact sampling circuit comprises a first silicon controlled rectifier, a second silicon controlled rectifier, a third silicon controlled rectifier and a fourth silicon controlled rectifier; the first and second silicon controlled rectifiers are connected in series, and the second and fourth silicon controlled rectifiers are connected in series to form a series parallel closed circuit with the series circuit composed of the first and third silicon controlled rectifier; one end of the contact of the gas density relay is electrically connected with the circuit between the first and third silicon controlled rectifiers through the circuit, and the other end is electrically connected to the circuit between the second and fourth silicon controlled rectifiers through the circuit.

8. The electrical system with online sampling and check function according to claim 1, characterized in that at least one of the intelligent control unit acquires a gas density value collected by the gas density detection sensor when the contact signal of the gas density relay acts or switches, and completes the online check of the gas density relay;
the intelligent control unit acquires a pressure value and temperature value collected by the gas density sensor when the contact signal of the gas density relay body is operated or switched, and converts them into the pressure value corresponding to 20° C. according to gas pressure-temperature characteristics, that is, the gas density value, and completes the online check of the gas density relay.

9. The electrical system with online sampling and check function according to claim 1, characterized in that at least one of the gas density relay is provided with a comparison density value output signal which is connected with the intelligent control unit; the gas density relay is provided with a comparison pressure value output signal which is connected with the intelligent control unit;
when the gas density relay outputs the output signal of the comparison density value, the intelligent control unit collects the current gas density value for comparison and checks the comparison density value of the gas density relay, while the intelligent control unit or the background compares the results for determination and gives an anomaly prompt if the error is out of tolerance;
when the gas density relay outputs relative density value output signals, the intelligent control unit collects a current gas density value for comparison to complete mutual check on the gas density relay and the gas density detection sensor, and the intelligent control unit or background performs determination on the comparison result and issues, if the error is out of tolerance, an abnormal prompt;

when the gas pressure relay outputs relative pressure value output signals, the intelligent control unit collects a current pressure value for comparison to complete mutual check on the gas pressure relay and the gas pressure detection sensor, and the intelligent control unit or background performs determination on the comparison result and issues, if error is out of tolerance, an abnormal prompt.

10. The electrical system with online sampling and check function according to claim 1, characterized in that the electrical system comprises at least two gas density sensors, and each gas density sensor comprises a pressure sensor and a temperature transducer; the gas density values detected by each gas density sensor are compared to complete a mutual check of each gas density sensor.

11. The electrical system with online sampling and check function according to claim 1, characterized in that the gas density sensor comprises at least two pressure sensors, and the pressure values collected by each pressure sensor are compared to complete a mutual check of each pressure sensor.

12. The electrical system with online sampling and check function according to claim 1, characterized in that the gas density sensor comprises at least two temperature transducers, and the temperature values collected by each temperature transducer are compared to complete a mutual check of each temperature transducer.

13. The electrical system with online sampling and check function according to claim 1, characterized in that at least one of the gas density sensor comprises at least one pressure sensor and at least one temperature transducer; the pressure value collected by each pressure sensor and the temperature value collected by each temperature transducer are randomly arranged and combined, and each combination is converted into multiple pressure values corresponding to 20° C. according to the gas pressure temperature characteristics, that is, the gas density value; each gas density value is compared to complete the mutual check of each pressure sensor and each temperature transducer;
the pressure value collected by each pressure sensor and the temperature value collected by each temperature transducer are all arranged and combined, and each combination is converted into multiple pressure values corresponding to 20° C. according to the gas pressure temperature characteristics, that is, the gas density value; each gas density value is compared to complete the mutual check of each pressure sensor and each temperature transducer;
a multiple gas density values obtained by each pressure sensor and temperature transducer are compared with the output signal of the gas density relay, to complete mutual check of the gas density relay, pressure sensor and temperature transducer.

14. A check method of gas density relay, characterized in that it comprises:
in a working state, monitoring by the gas density relay the gas density value in the electrical equipment;
performing by the intelligent control unit or the gas density relay operations of at least one of according to the set check time, check instructions, gas density values, temperature values, under the condition of allowing to check the gas density relay:
controlling by the intelligent control unit the temperature regulation mechanism, so that the temperature of the gas density relay rises, then the temperature of the temperature compensation element of the gas density relay rises, the gas density relay takes contact action, the contact action is transmitted to the intelligent control unit via the online check contact signal sampling unit, and
acquiring by the intelligent control unit a gas density value according to the pressure value and the temperature value in the contact action, or acquiring the gas density value directly, and detecting the contact signal operating value of the gas density relay, to complete the check of the contact signal operating value of the gas density relay;
upon completion of check of all contact signals, shutting off by the intelligent control unit the heating element of the temperature regulating mechanism.

15. The check method for the gas density relay according to claim 14, wherein the method comprises the following step:
in a working state, monitoring by the gas density relay the gas density value in the electrical equipment, and at the same time, monitoring by the gas density relay the gas density value in the electrical equipment online via a gas density detection sensor and the intelligent control unit;
performing by at least one of the intelligent control unit or the gas density relay operations according to the set check time check instructions, gas density values temperature values, under the condition of allowing to check the gas density relay:
adjusting by the intelligent control unit the online check contact signal sampling unit into a check state, cutting off by the online check contact signal sampling unit the control loop of contact signals of the gas density relay in the check state, and connecting contacts of the gas density relay to the intelligent control unit;
controlling by the intelligent control unit the temperature regulation mechanism, so that the temperature of the gas density relay rises, then the temperature of the temperature compensation element of the gas density relay rises, the gas density relaytakes contact action, the contact action is transmitted to the intelligent control unit via the online check contact signal sampling unit, and the intelligent control unit acquires a gas density value according to the pressure value and the temperature value in the contact action, or acquires the gas density value directly, and detects the contact signal operating value of the gas density relay, to complete the check of the contact signal operating value of the gas density relay;
controlling by the intelligent control unit the temperature regulation mechanism, so that the temperature of the gas density relay is reduced, then the temperature of the temperature compensation element of the gas density relay is reduced, contact reset occurs to the gas density relay, and the contact reset is transmitted to the intelligent control unit via the online check contact signal sampling unit;
acquiring by the intelligent control unit a gas density value according to the pressure value and the temperature value in the contact reset, or acquiring the gas density value directly, and detecting the contact signal return value of the gas density relay, to complete the check of the contact signal return value of the gas density relay;
after the check of all the contact signals is completed, turning off the intelligent control unit the heating element of the temperature regulation mechanism, and adjusting the online check contact signal sampling unit into a working state, and recovering the control loop of the contact signals of the gas density relay to a normal working state.

16. The check method of gas density relay according to claim 14, characterized in that at least one of the gas density relay further comprises a pressure regulating mechanism, and the gas path of the pressure regulating mechanism is connected with the gas path of the gas density relay; the check method comprises:

in a working state, monitoring by the gas density relay the gas density value in the electrical equipment;

performing by the intelligent control unit or the gas density relay operations according to the set check time, check instructions, gas density values temperature values, under the condition of allowing to check the gas density relay:

closing the valve via the intelligent control unit;

driving by the intelligent control unit the pressure regulation mechanism to reduce gas pressure slowly, controlling by the intelligent control unit the temperature regulation mechanism to raise the temperature of the gas density relay, then rising the temperature of the temperature compensation element of the gas density relay, taking by the gas density relay contact action, transmitting the contact action to the intelligent control unit via the online check contact signal sampling unit, and acquiring by the intelligent control unit a gas density value according to the pressure value and the temperature value in the contact action, or acquiring the gas density value directly, and detecting the contact signal operating value of the gas density relay, to completing the check of the contact signal operating value of the gas density relay;

when the check of all the contact signals is completed, opening by the intelligent control unit the valve and shutting off the heating element of the temperature regulating mechanism.

17. The check method of gas density relay according to claim 14, characterized in that at least one of the gas density relay further comprises a pressure regulating mechanism, and the gas path of the pressure regulating mechanism is connected with the gas path of the gas density relay; the check method comprises:

in a normal working state, monitoring by the gas density relay the gas density value in the electrical equipment, and at the same time, monitoring by the gas density relay the gas density value in the electrical equipment online via a gas density detection sensor and the intelligent control unit;

performing by the intelligent control unit or the gas density relay operations according to the set check time check instructions, gas density values and/or temperature values, under the condition of allowing to check the gas density relay:

closing the valve via the intelligent control unit;

adjusting by the intelligent control unit the online check contact signal sampling unit into a check state, cutting off the online check contact signal sampling unit the control loop of contact signals of the gas density relay in the check state, and connecting contacts of the gas density relay to the intelligent control unit;

controlling by the intelligent control unit the temperature regulation mechanism to increase the temperature of the gas density relay, then the temperature of the temperature compensation element of the gas density relay rises, driving by the intelligent control unit the pressure regulation mechanism to reduce gas pressure slowly, taking by the gas density relay contact action, transmitting the contact action to the intelligent control unit via the online check contact signal sampling unit, and acquiring by the intelligent control unit a gas density value according to the pressure value and the temperature value in the contact action, or acquiring by the gas density value directly, and detecting the contact signal operating value of the gas density relay, to complete the check of the contact signal operating value of the gas density relay;

controlling by the intelligent control unit the temperature regulation mechanism to reduce the temperature of the gas density relay, then the temperature of the temperature compensation element of the gas density relay is reduced, driving by the intelligent control unit the pressure regulation mechanism to increase gas pressure slowly, contact reset occurs to the gas density relay, the contact reset is transmitted to the intelligent control unit via the online check contact signal sampling unit, and acquiring by the intelligent control unit a gas density value according to the pressure value and the temperature value in the contact reset, or acquires the gas density value directly, and detects a contact signal return value of the gas density relay, to complete the check of the contact signal return value of the gas density relay;

after the check of all the contact signals is completed, opening by the intelligent control unit the valve, shutting off the heating element of the temperature regulation mechanism, and adjusting the online check contact signal sampling unit into a working state, and recovering the control loop of the contact signals of the gas density relay to a normal working state.

18. The check method for the gas density relay according to claim 14, wherein the method comprises the following step:

in a working state, monitoring the gas density relay the gas density value in the electrical equipment, and at the same time, monitoring by the gas density relay the gas density value in the electrical equipment online via a gas density detection sensor and the intelligent control unit;

performing by the intelligent control unit or the gas density relay operations according at least one of to the set check time, check instructions, gas density values temperature values, under the condition of allowing to check the gas density relay:

adjusting by the intelligent control unit the contact signal sampling unit into a check state, the contact signal sampling unit cuts off the control loop of contact signals of the gas density relay in the check state, and connecting contacts of the gas density relay to the intelligent control unit;

controlling by the intelligent control unit the temperature regulation mechanism to increase the temperature of gas in the gas density relay, and closing by the intelligent control unit the valve after the temperature reaches a set value;

after the temperature or pressure of gas in the gas density relay falls to a set value, controlling by the intelligent control unit the temperature regulation mechanism to increase the temperature of the gas density relay, then rising the temperature of the temperature compensation element of the gas density relay, occurring a contact action to the gas density relay, transmitting the contact action to the intelligent control unit via the contact signal sampling unit, and obtaining by the intelligent control unit a gas density value according to the pressure value and the temperature value in the contact action, or obtaining the gas density value directly, and detecting the contact signal operating value of the gas density relay, to complete the check of the contact signal operating value of the gas density relay;

when the check of all the contact signals is completed, opening the intelligent control unit the valve and shuts off the temperature regulating mechanism.

19. The check method of gas density relay according to claim 14, characterized in that the gas density relay also comprises a gas chamber and a heating member, where the air chamber is connected with the gas density relay, and the heating member is installed outside or inside the air chamber; the check method comprises:

in a working state, monitoring the gas density relay the gas density value in the electrical equipment, and at the same time, monitoring the gas density relay the gas density value in the electrical equipment online via a gas density detection sensor and the intelligent control unit;

performing by the intelligent control unit or the gas density relay operations according at least one of to the set check time, check instructions, gas density values, temperature values, under the condition of allowing to check the gas density relay:

adjusting by the intelligent control unit the contact signal sampling unit into a check state, cutting off the contact signal sampling unit the control loop of contact signals of the gas density relay in the check state, and connecting contacts of the gas density relay to the intelligent control unit;

controlling by the intelligent control unit the heating member to heat so as to change the temperature of gas in the air chamber between the valve and the gas density relay, and after the temperature reaches a set value, closing by the intelligent control unit the valve and shuts off the heating member;

after the temperature or pressure of the air chamber falls to a set value, controlling by the intelligent control unit the temperature regulation mechanism to increase the temperature of the gas density relay, then rising the temperature of the temperature compensation element of the gas density relay, occurring a contact action to the gas density relay, transmitting the contact action to the intelligent control unit via the contact signal sampling unit, and obtaining by the intelligent control unit a gas density value according to the pressure value and the temperature value in the contact action, or obtaining the gas density value directly, and detecting the contact signal operating value of the gas density relay, to complete the check of the contact signal operating value of the gas density relay;

when the check of all the contact signals is completed, opening by the intelligent control unit the valve and shuts off the temperature regulating mechanism.

20. The check method of gas density relay according to claim 14, characterized in that the gas density relay also comprises a gas chamber and a heating member, where the air chamber is connected with the gas density relay, and the heating member is installed outside or inside the air chamber; the check method comprises:

in a working state, monitoring the gas density relay the gas density value in the electrical equipment, and at the same time, monitoring by the gas density relay the gas density value in the electrical equipment online via a gas density detection sensor and the intelligent control unit;

performing by the intelligent control unit or the gas density relay operations according at least one of to the set check time, check instructions, gas density values, temperature values, under the condition of allowing to check the gas density relay:

adjusting by the intelligent control unit the contact signal sampling unit into a check state, cutting off the contact signal sampling unit the control loop of contact signals of the gas density relay in the check state, and connecting contacts of the gas density relay to the intelligent control unit;

using by the intelligent control unit to control heating by the heating member, which leads to change in temperature of gas in air chamber; using the intelligent control unit to shut off the valve after reaching the set value, and then using intelligent control unit to turn off the heating member;

after the temperature or pressure of the air chamber falls to a set value, controlling the intelligent control unit the temperature regulation mechanism to increase the temperature of the gas density relay, then rising the temperature of the temperature compensation element of the gas density relay, occurring a contact action to the gas density relay, transmitting the contact action to the intelligent control unit via the contact signal sampling unit, and obtaining the intelligent control unit a gas density value according to the pressure value and the temperature value in the contact action, or obtaining the gas density value directly, and detecting the contact signal operating value of the gas density relay, to complete the check of the contact signal operating value of the gas density relay; when the check of all the contact signals is completed, opening by the intelligent control unit the valve and shutting off the temperature regulating mechanism.

\* \* \* \* \*